(12) United States Patent
Marin et al.

(10) Patent No.: US 11,227,849 B2
(45) Date of Patent: Jan. 18, 2022

(54) ELECTROLESS-CATALYST DOPED-MOLD MATERIALS FOR INTEGRATED-CIRCUIT DIE PACKAGING ARCHITECTURES

(71) Applicant: Intel Corporation, Santa Clara, CA (US)

(72) Inventors: Brandon C Marin, Chandler, AZ (US); Srinivas V. Pietambaram, Chandler, AZ (US); Kristof Darmawikarta, Chandler, AZ (US); Gang Duan, Chandler, AZ (US); Sameer Paital, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 16/582,865

(22) Filed: Sep. 25, 2019

(65) Prior Publication Data

US 2021/0091030 A1    Mar. 25, 2021

(51) Int. Cl.
*H01L 23/00* (2006.01)

(52) U.S. Cl.
CPC .............. *H01L 24/11* (2013.01); *H01L 24/13* (2013.01); *H01L 2224/1163* (2013.01); *H01L 2224/11464* (2013.01); *H01L 2224/12105* (2013.01); *H01L 2224/13026* (2013.01)

(58) Field of Classification Search
CPC ................... H01L 24/11; H01L 24/13; H01L 2224/11464; H01L 2224/13026; H01L 2224/1163; H01L 2224/12105
See application file for complete search history.

(56) References Cited

U.S. PATENT DOCUMENTS

| 9,105,628 B1* | 8/2015 | Dubin ............... H01L 21/76831 |
| 2020/0381391 A1* | 12/2020 | Yu ....................... H01L 23/5384 |

* cited by examiner

*Primary Examiner* — Quoc D Hoang
(74) *Attorney, Agent, or Firm* — Schwegman Lundberg & Woessner, P.A.

(57) ABSTRACT

Disclosed embodiments include a catalyst-doped mold interconnect system, where activated catalyst particles that line via and trace corridors, are used for electroless-plating formation of both liners and vias and traces that also electrolessly plate onto the liners. Photolithographically formed interconnects can be mingled with laser-ablation form-factor vias and traces within a single stratum of a catalyst doped mold interconnect system.

17 Claims, 11 Drawing Sheets

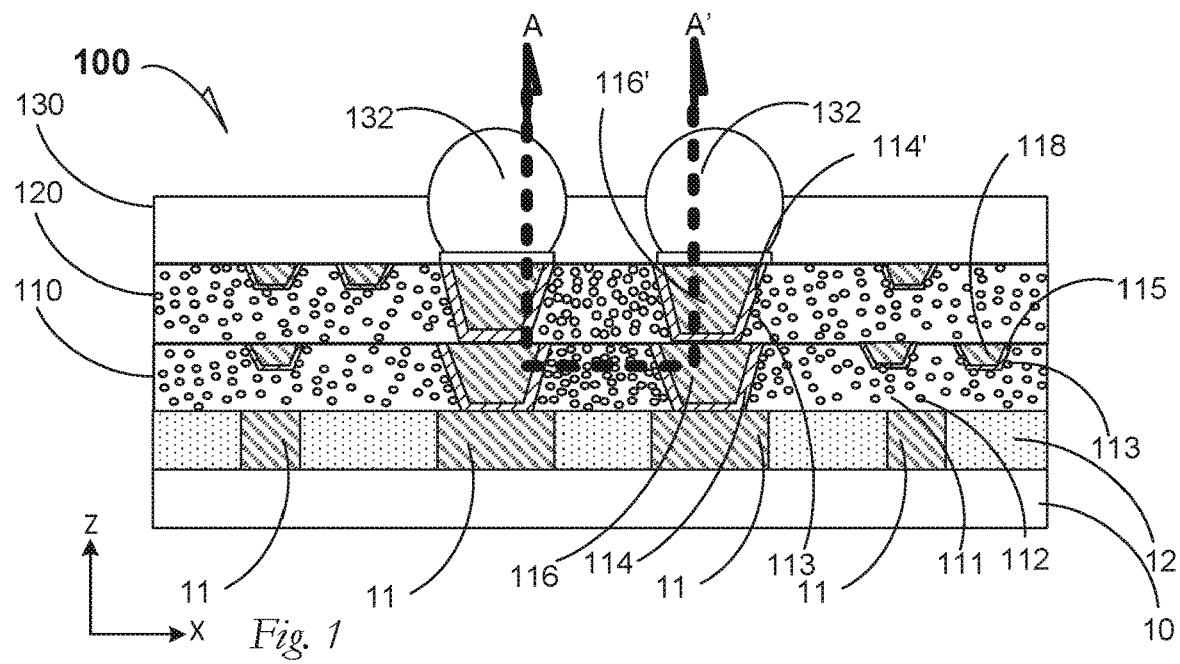
*Fig. 1*
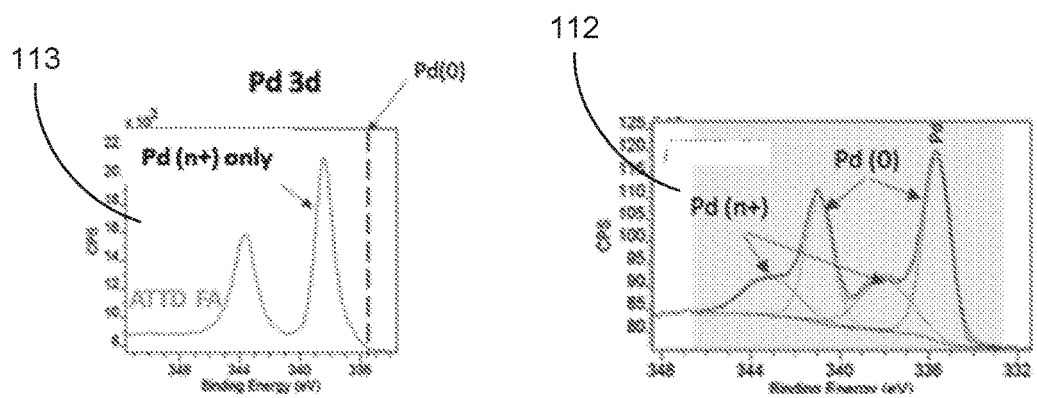
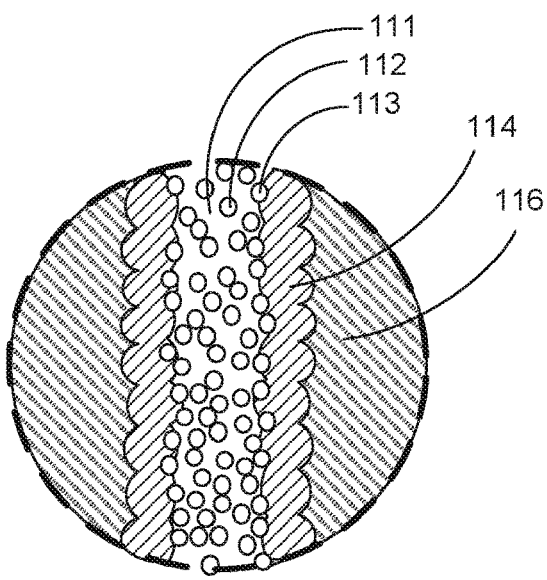
*Fig. 1A*

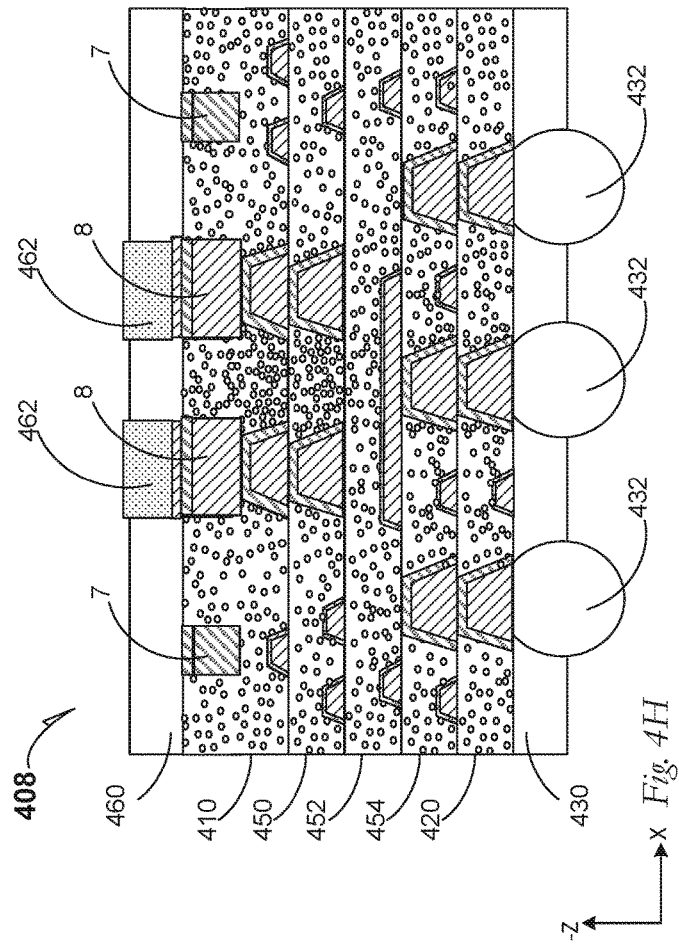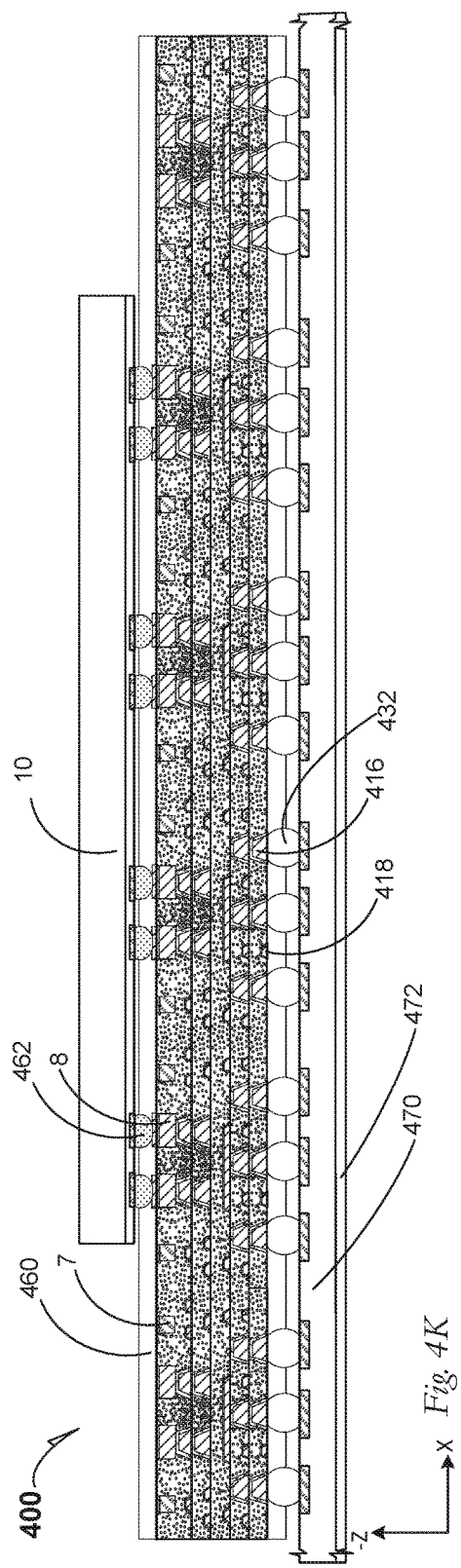

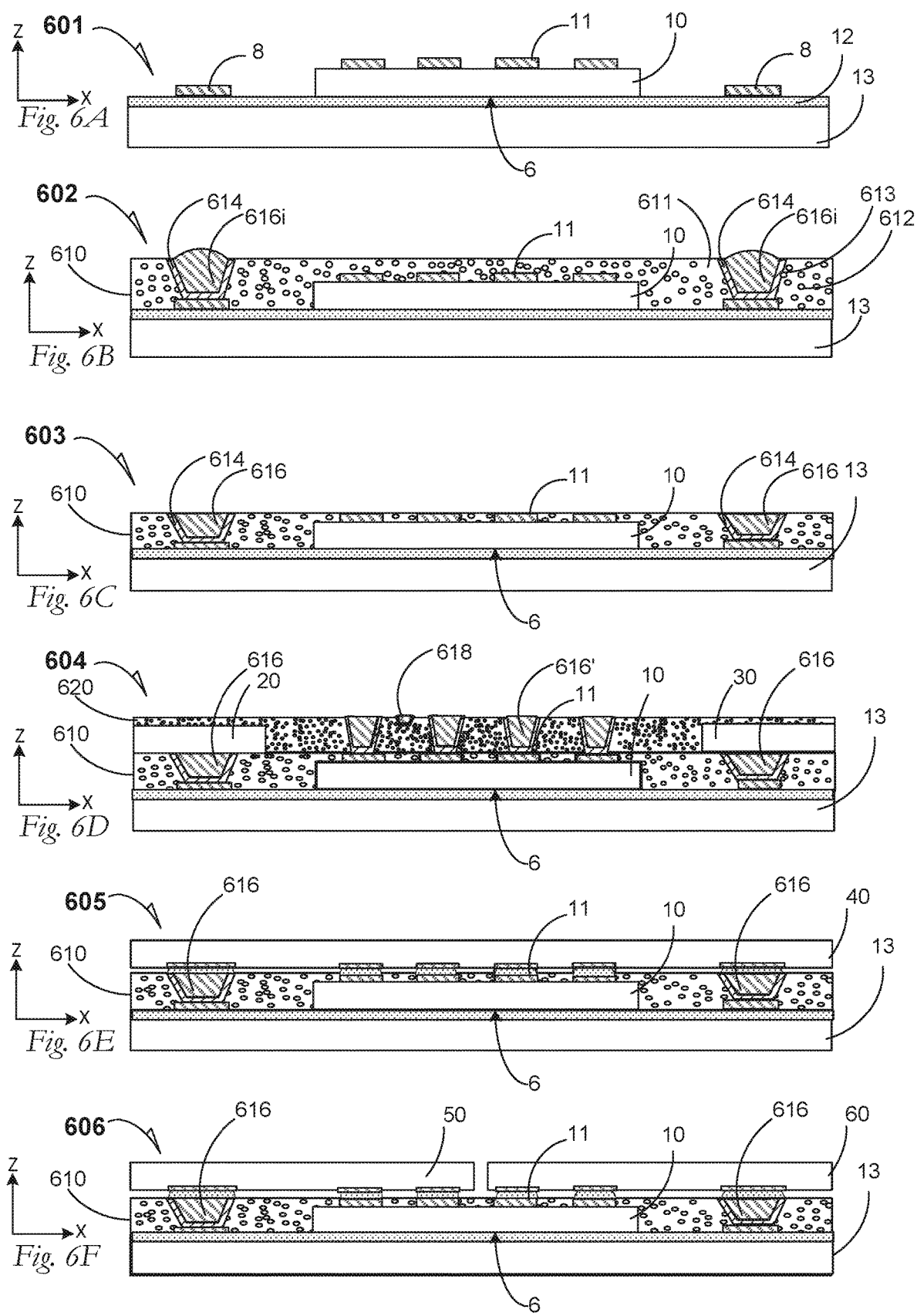

ELECTROLESS-CATALYST DOPED-MOLD MATERIALS FOR INTEGRATED-CIRCUIT DIE PACKAGING ARCHITECTURES

FIELD

This disclosure relates to catalyst-doped mold materials for interconnect systems in integrated-circuit package substrates.

BACKGROUND

Packaging materials have included build-up films, which requires laser drilling and low-profile layers to facilitate processing.

A mold interconnect system (MIS) packaging architecture can be used, although a seed layer is first placed below a given mold layer, which presents etching challenges and adhesion issues of the seed layer.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1 is a cross-section elevation of an integrated-circuit package that employs a doped mold interconnect system according to several embodiments Respective absorption diagrams 112 and 113, correspond to palladium (Pd) particle analysis for the inactive catalyst particles, and the activated catalyst particles in the mold-material matrix depicted in FIG. 1;

FIG. 1A is a cross-section top view of a portion of the structure depicted in FIG. 1, by rotating the arrows A-A' through 180° in the X-Y plane according to an embodiment;

Figure 2A:
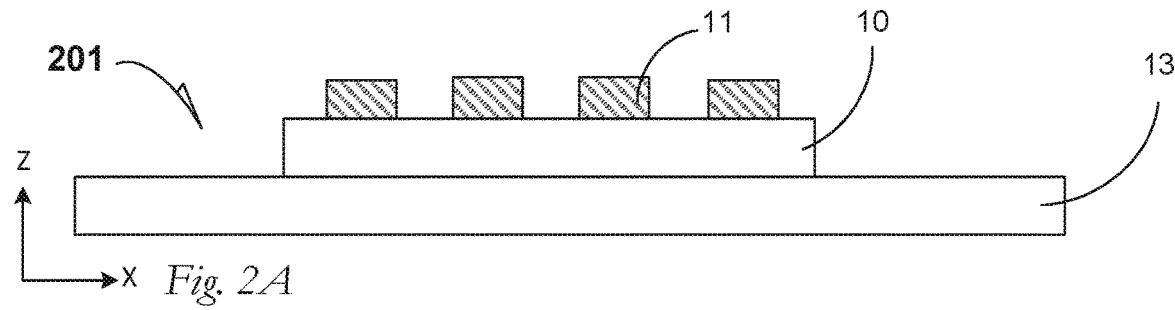
FIG. 2A represents an assembly of selected structures of a "die-first" integrated-circuit package during assembly that employs a doped mold interconnect system according to several embodiments.
Figure 2B:
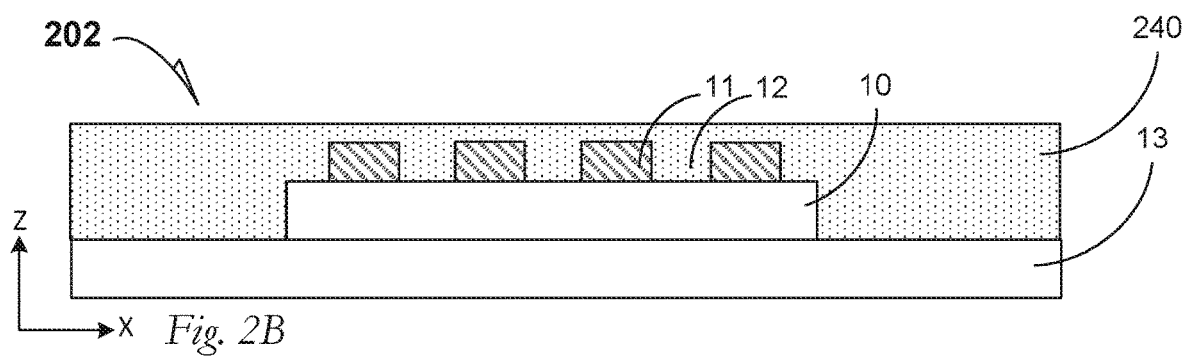
Figure 2C:
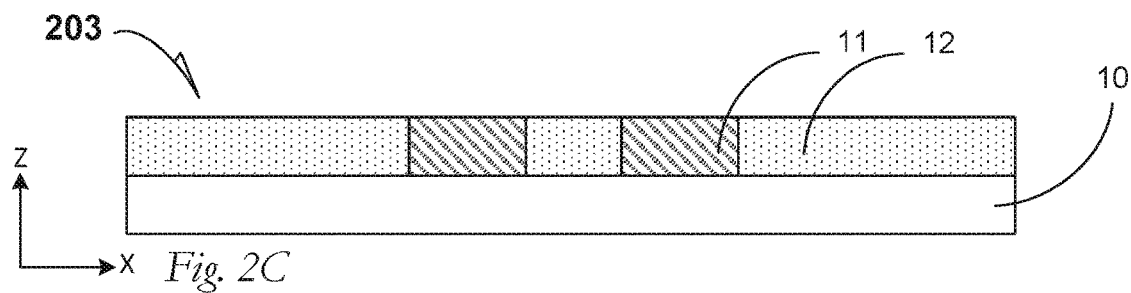
Figure 2D:
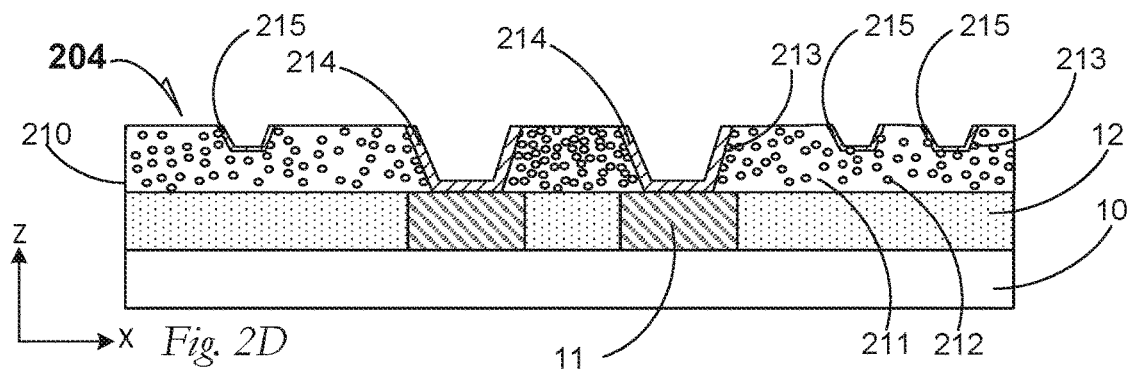
Figure 2E:
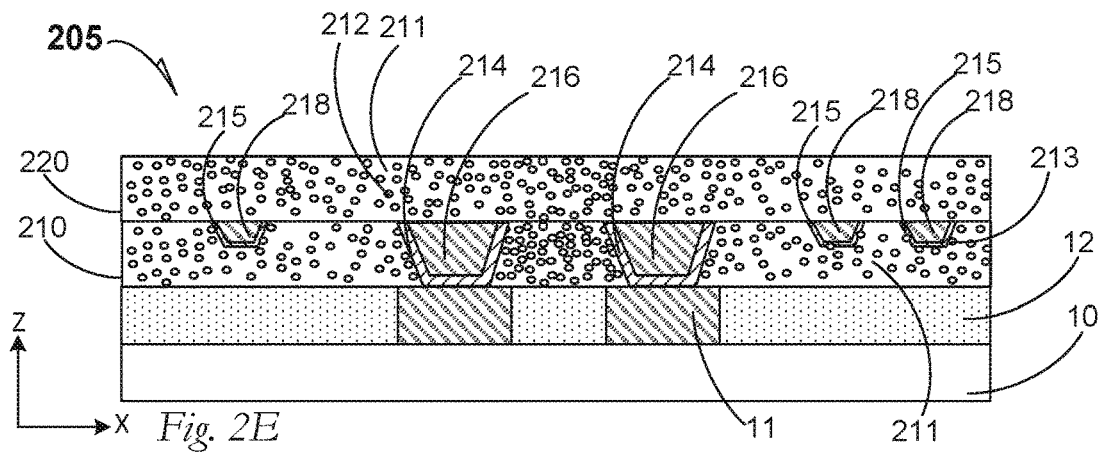
Figure 2F:
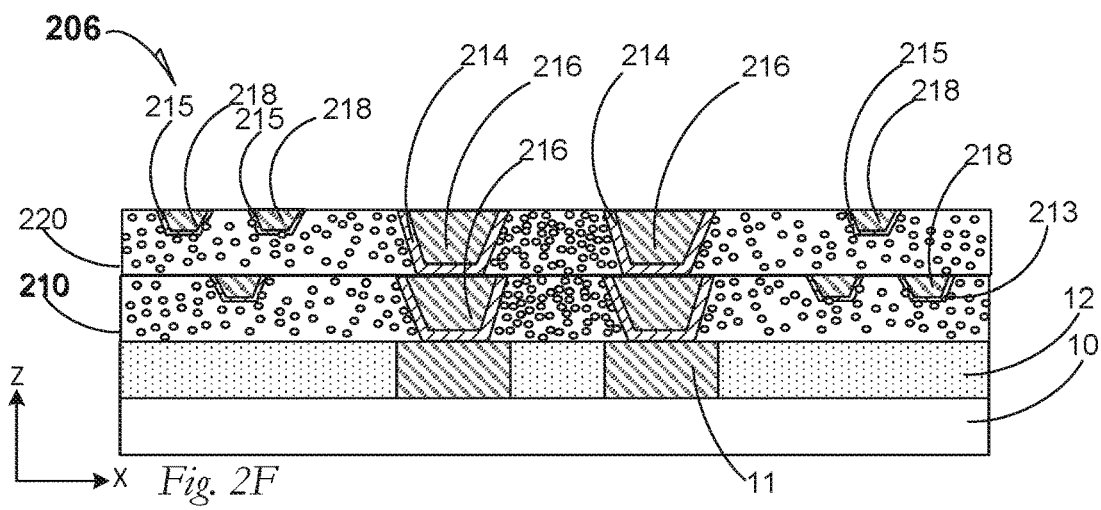
Figure 2G:
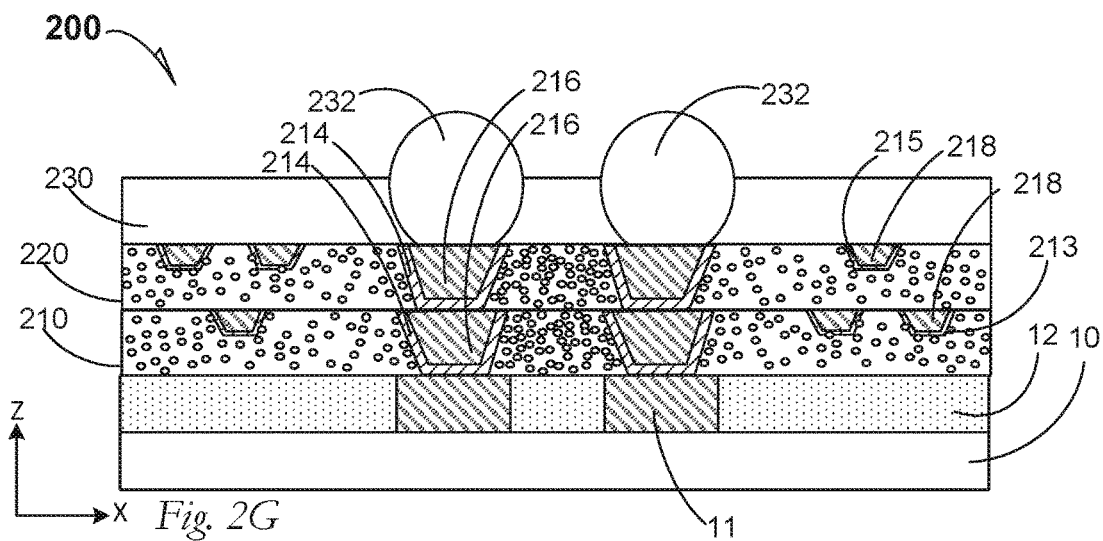
Figure 3A:
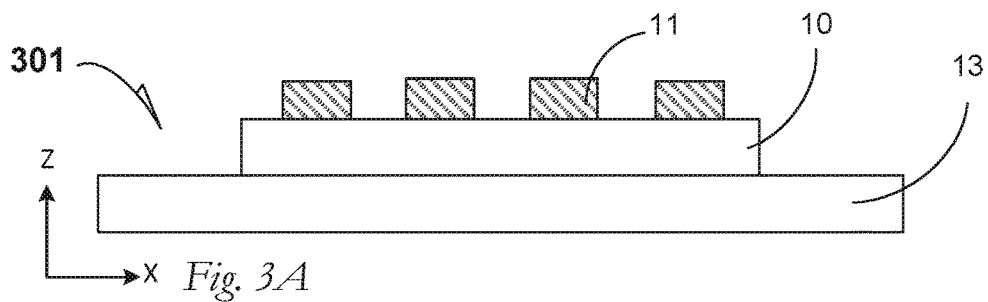
Figure 3B:
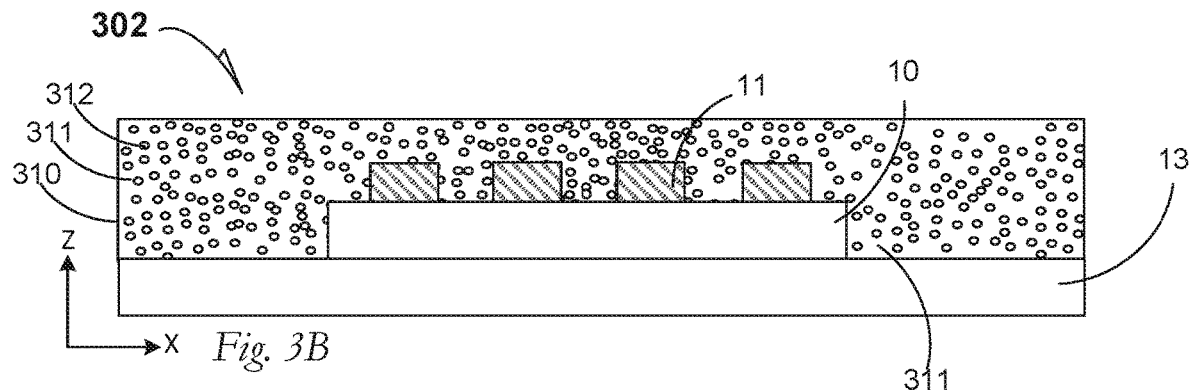
Figure 3C:
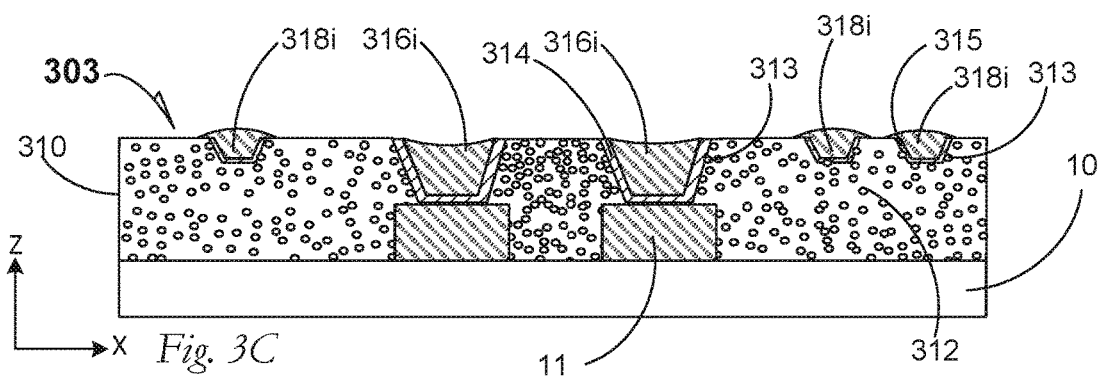
Figure 3D:
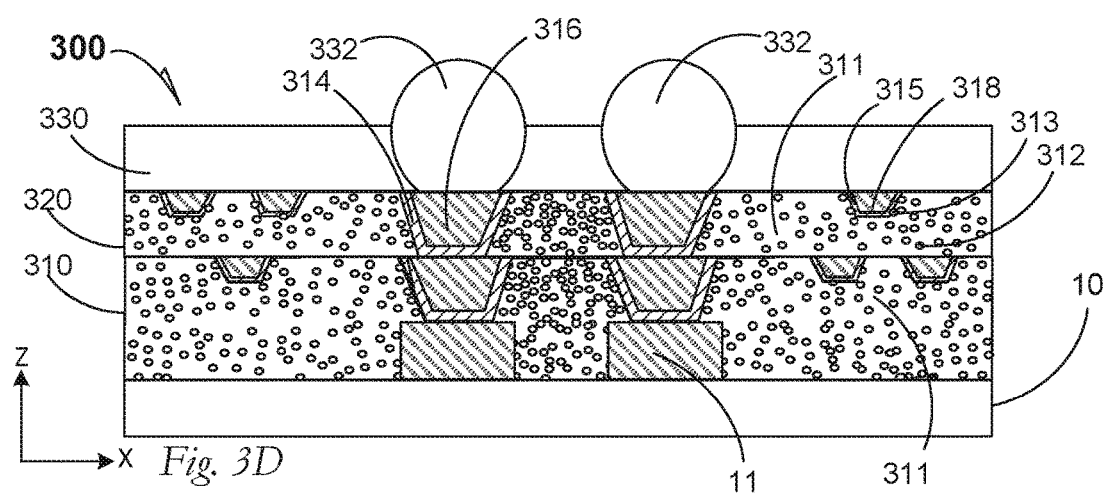
Figure 4A:
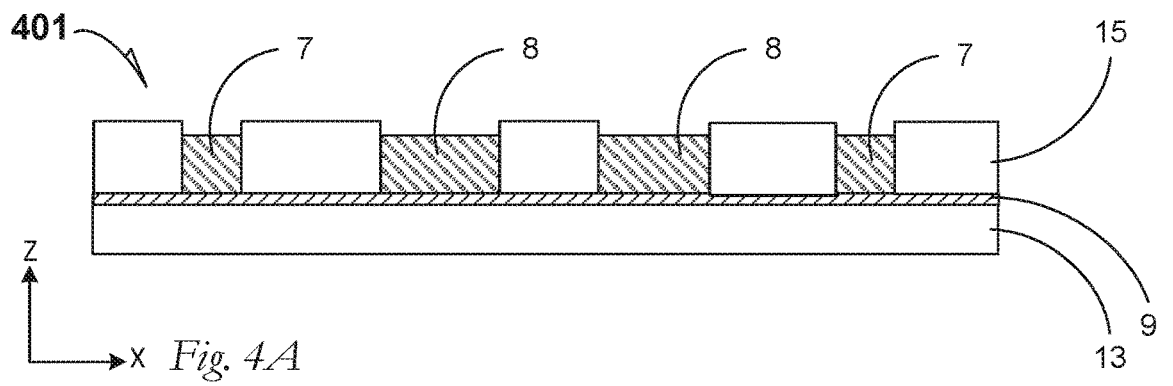
Figure 4B:
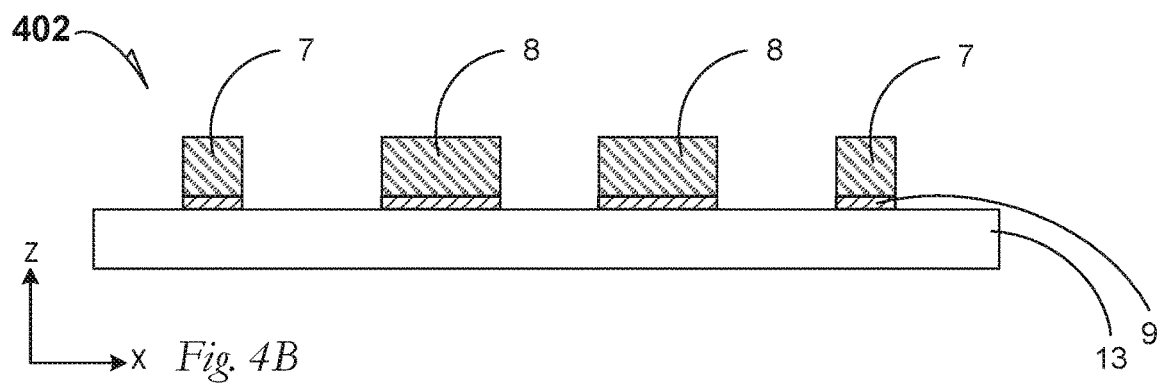
Figure 4C:
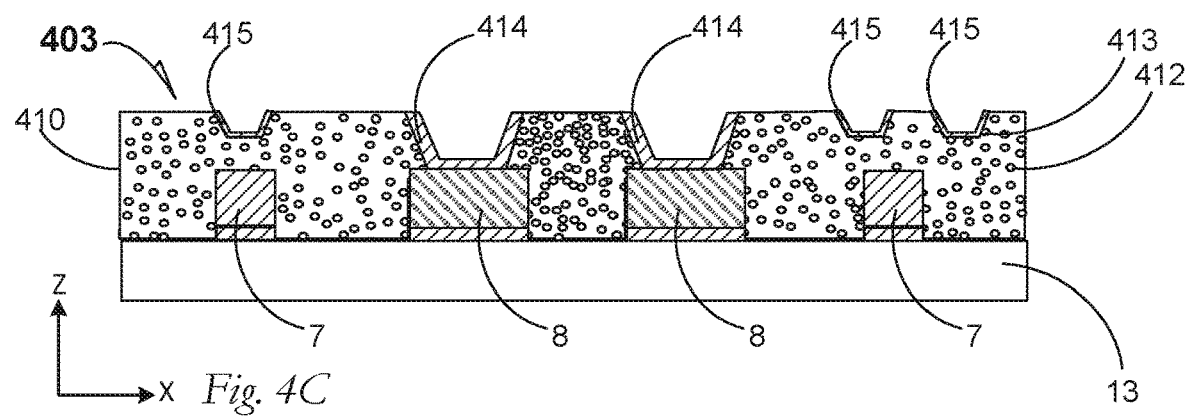
Figure 4D:
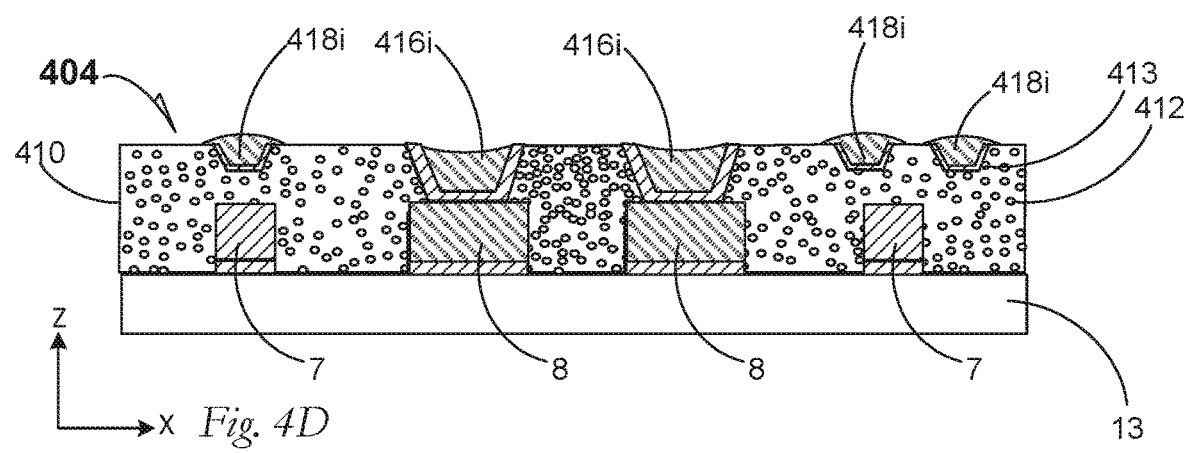
Figure 4E:
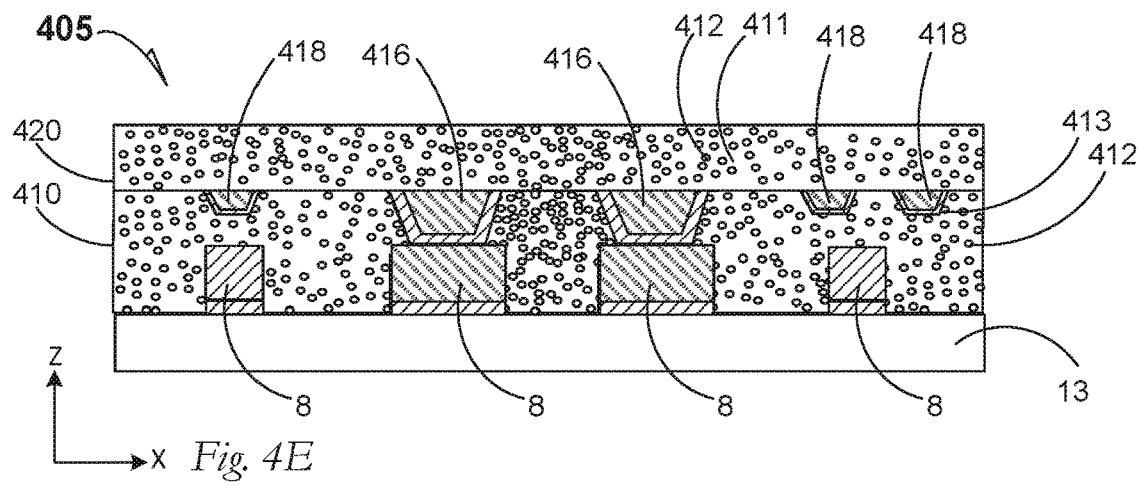
Figure 4F:
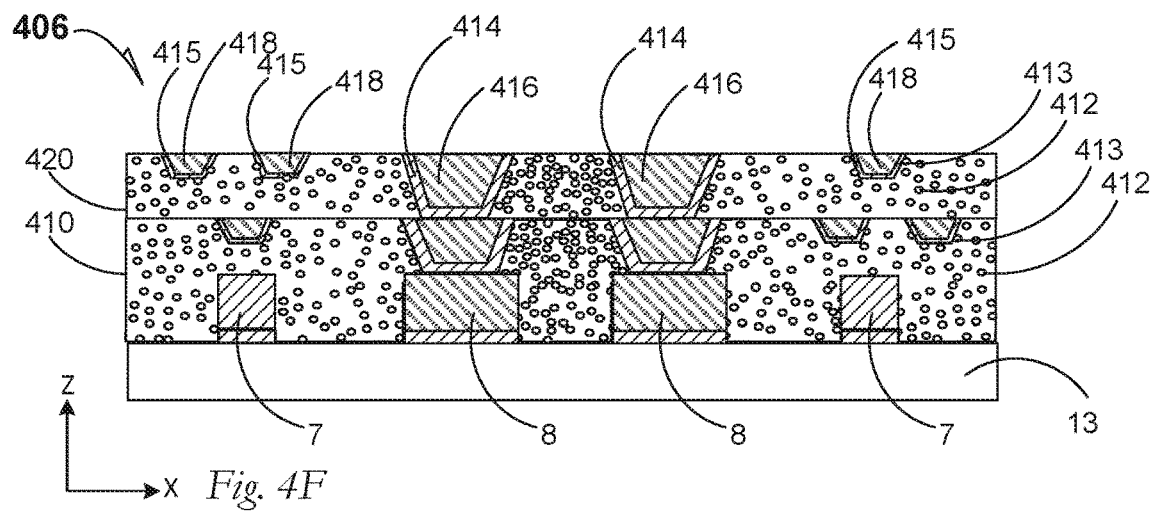
Figure 4G:
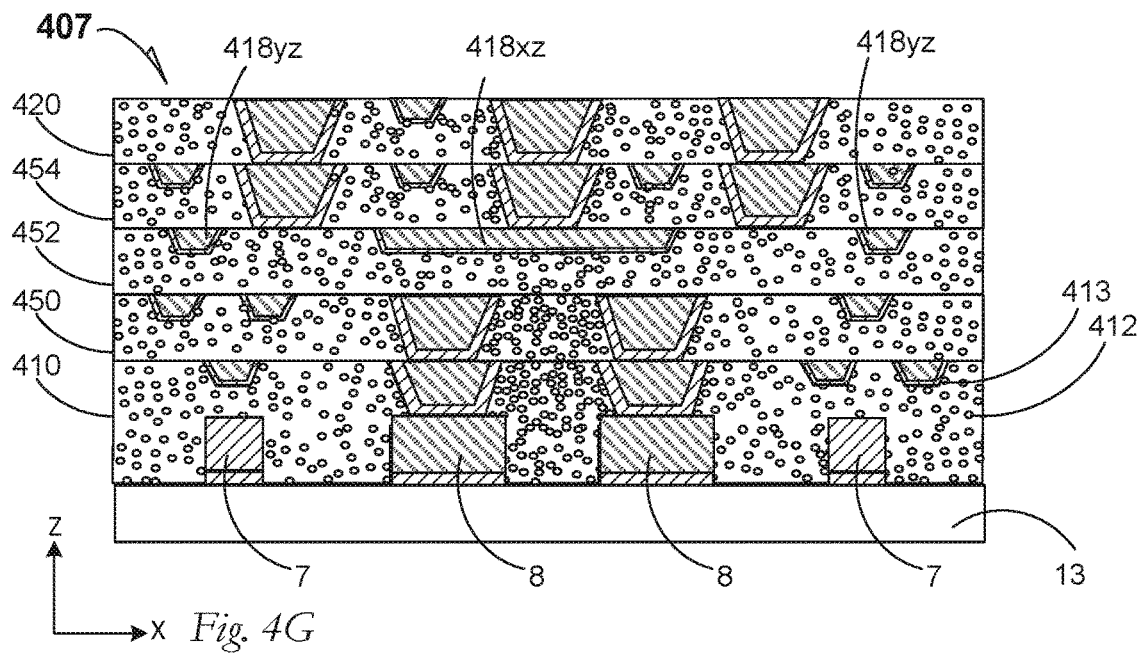
Figure 5A:
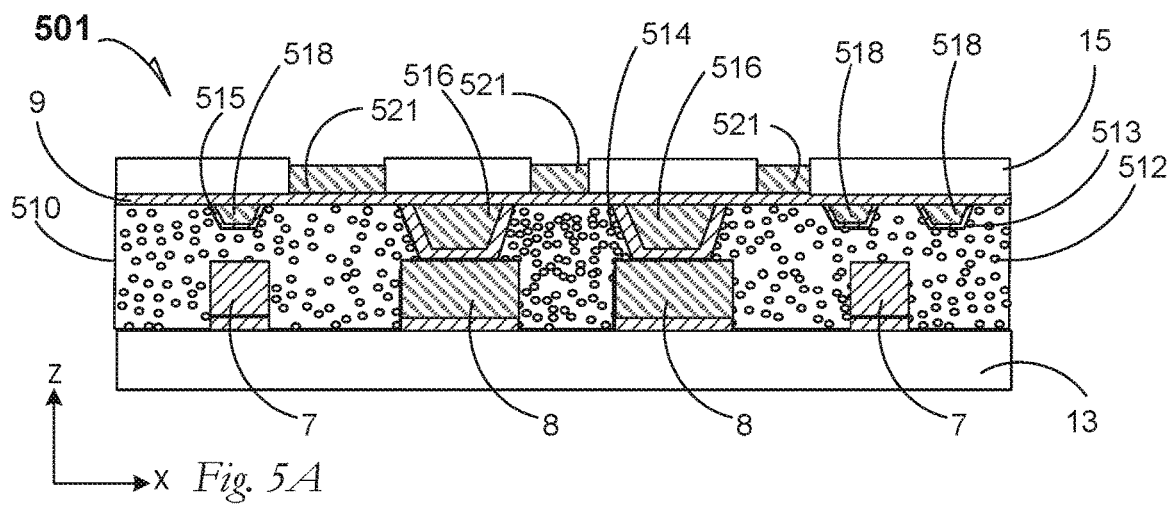
Figure 5B:
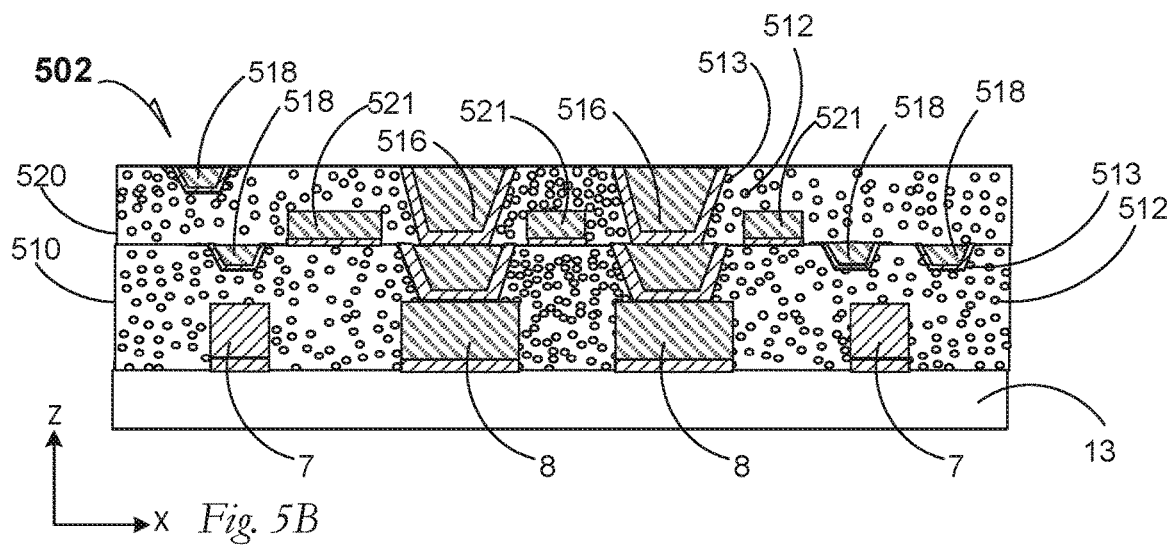
Figure 5C:
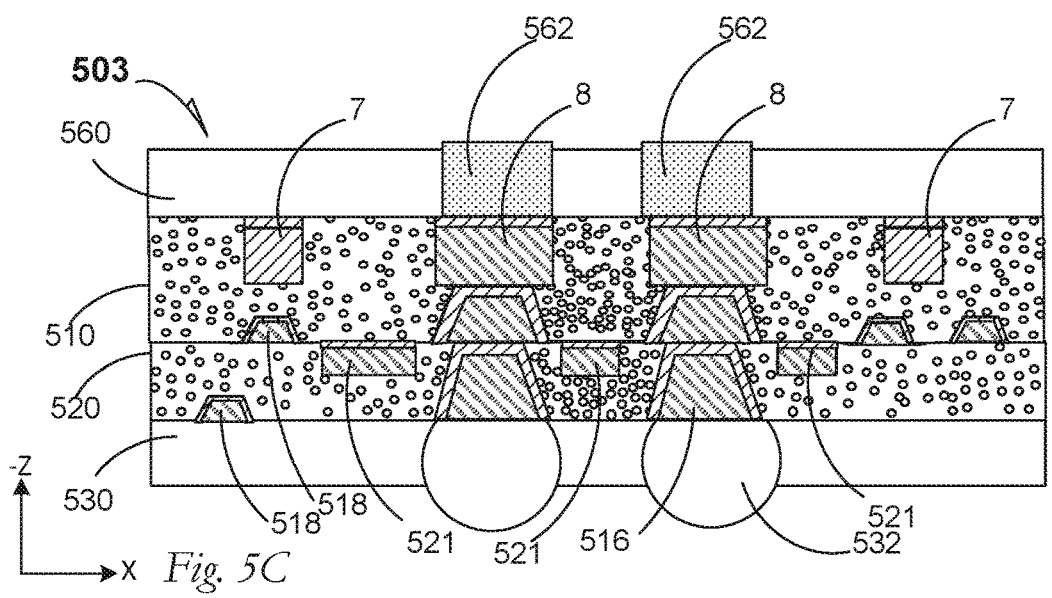
Figure 7:
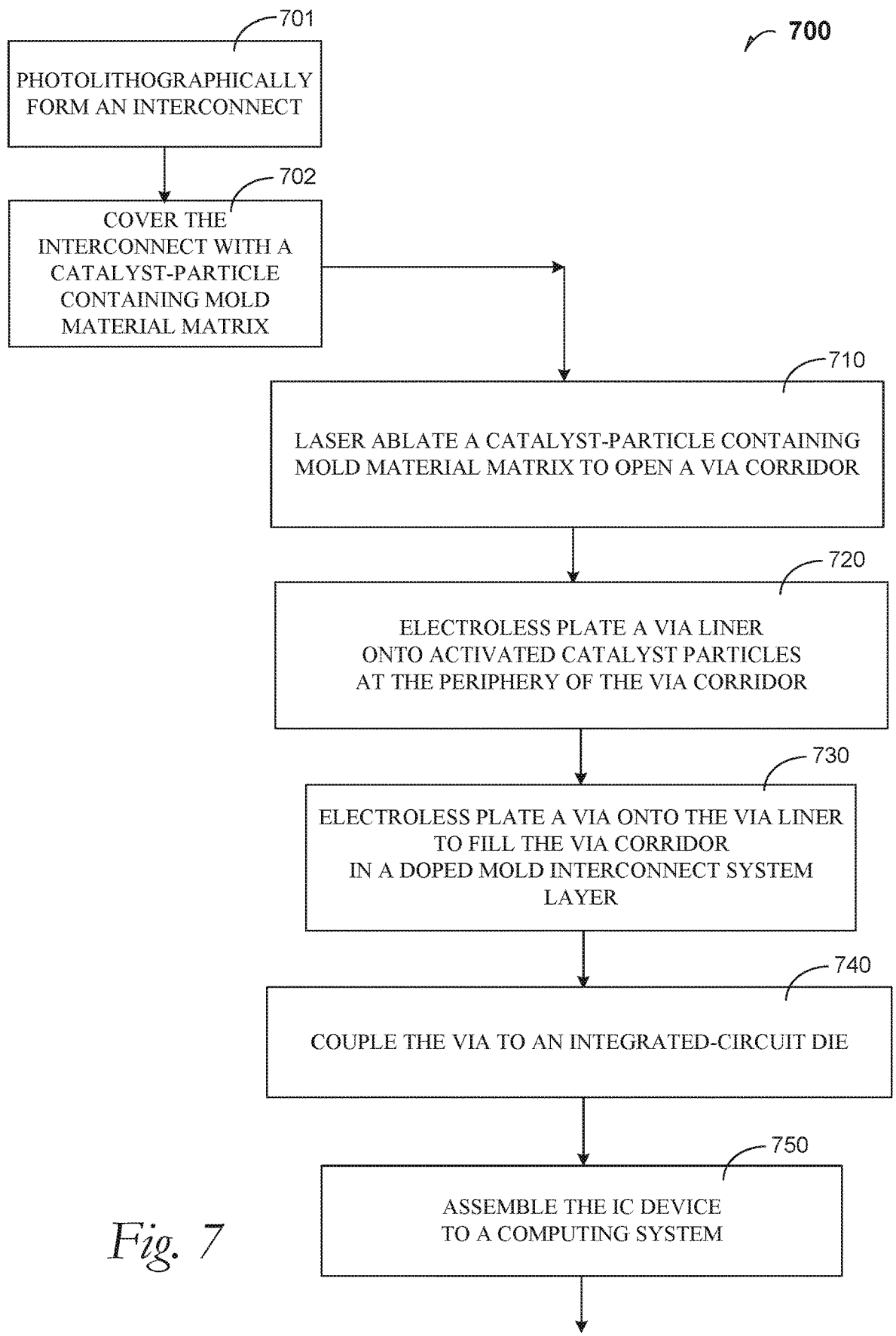
Figure 8:
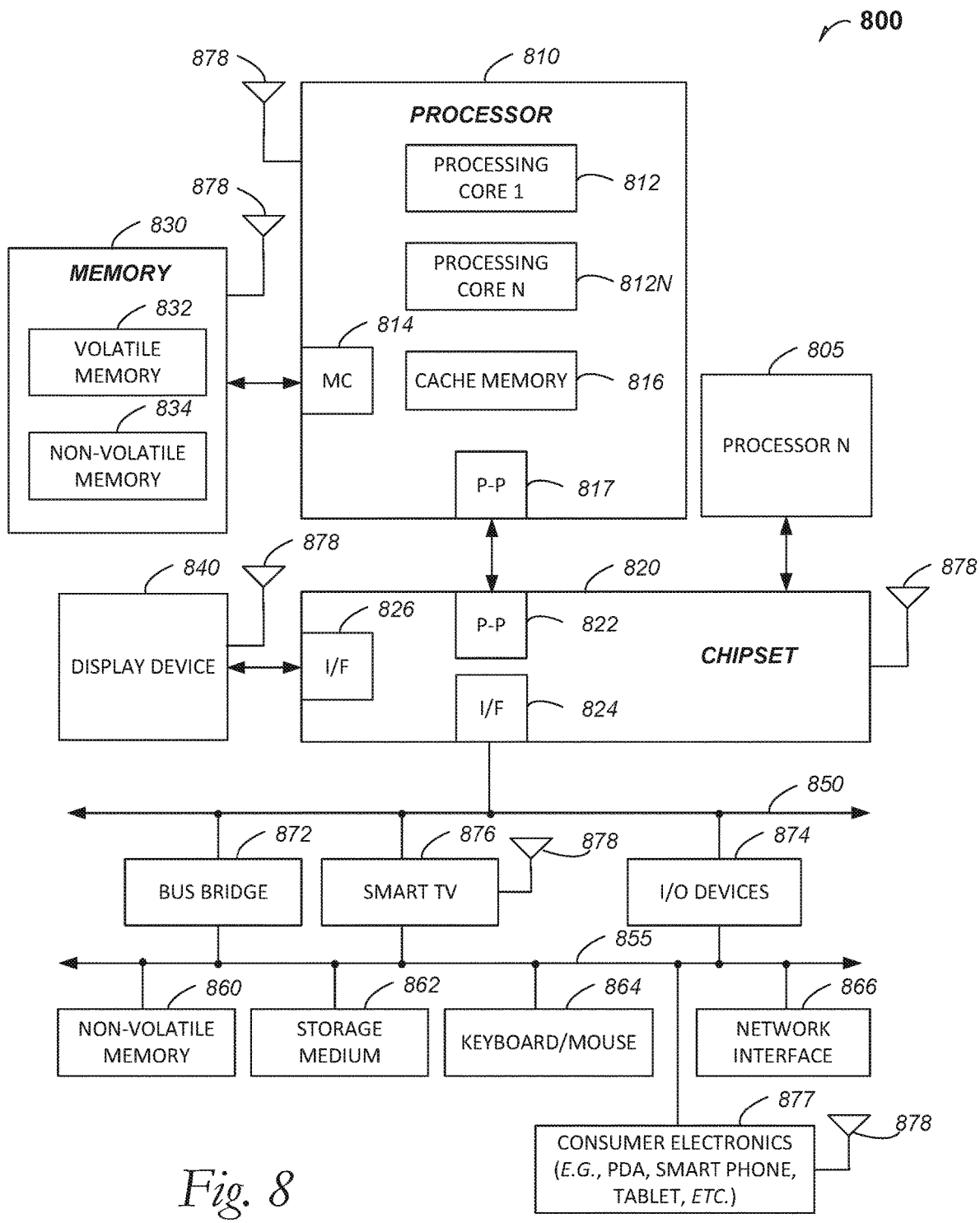

At FIG. 2B, the assembly in FIG. 2A has been processed according to an embodiment;

At FIG. 2C, the assembly in FIG. 2B has been processed according to an embodiment;

At FIG. 2D, the assembly in FIG. 2C has been processed according to an embodiment;

At FIG. 2E the assembly in FIG. 2D has been processed according to an embodiment;

At FIG. 2F the assembly in FIG. 2E has been processed according to an embodiment;

At FIG. 2G the assembly in FIG. 2F has been processed to a doped mold-interconnect system-layer containing integrated-circuit package according to an embodiment;

FIG. 3A is a cross-section elevation of an integrated-circuit package during assembly according to an embodiment;

At FIG. 3B, the assembly in FIG. 3A has been processed according to an embodiment;

At FIG. 3C, the assembly in FIG. 3B has been processed according to an embodiment;

At FIG. 3D, the assembly in FIG. 3C has been processed to a doped mold-interconnect system layer-containing integrated-circuit package according to an embodiment;

FIG. 4A is a cross-section elevation of a doped mold integration system during a "die-last" assembly technique according to an embodiment;

FIG. 4B is a cross-section elevation of the assembly depicted in FIG. 4A after further processing according to an embodiment;

FIG. 4C is a cross-section elevation of an assembly after further processing of the assembly depicted in FIG. 4B according to an embodiment;

FIG. 4D is a cross-section elevation of an assembly after further processing of the assembly depicted in FIG. 4C according to an embodiment;

FIG. 4E is cross-sectional elevation of an assembly that is being post-processed from the assembly depicted in FIG. 4D according to an embodiment;

At FIG. 4F the assembly in FIG. 4E has been processed to an assembly according to an embodiment;

At FIG. 4G the assembly in FIG. 4F has been processed to an assembly according to a branching embodiment;

FIG. 4H is a cross-section elevation of an integrated-circuit package containing doped mold interconnect system layers according to an embodiment. Items 4I and 4J are omitted;

FIG. 4K is a cross-section elevation of an integrated-circuit die package that includes several doped mold interconnect system layers according to several embodiments. Items 4I and 4J are omitted;

FIG. 5A is a cross-section elevation of a doped mold-interconnect system that mixes laser-formed contacts and photolithographically formed traces according to an embodiment;

FIG. 5B is a cross-section elevation of a doped mold interconnect system after further processing of the doped mold interconnect system depicted in FIG. 5A according to several embodiments;

FIG. 5C is a cross-section elevation of a doped mold-interconnect system integrated-circuit package substrate after further processing the assembly depicted in FIG. 5B according to several embodiments;

FIG. 6A is cross-section elevation of an embedded multi-die integrated-circuit package during assembly, that uses doped mold interconnect system layers according to a several embodiments;

FIG. 6B is a cross-section elevation of the assembly depicted in FIG. 6A after further processing according to an embodiment;

FIG. 6C is a cross-section elevation of an assembly that contains a catalyst-doped mold interconnect system layer after back grinding according to an embodiment;

FIG. 3D is a cross-section elevation of an assembly after further processing the assembly depicted in FIG. 6C according to an embodiment;

FIG. 6E is a cross-section elevation of an assembly after further processing the assembly depicted in FIG. 6C according to an embodiment;

FIG. 6F is a cross-section elevation of an assembly after further processing the assembly depicted in FIG. 6C according to an embodiment;

FIG. 7 is a process flow diagram for assembling an integrated-circuit apparatus that includes a doped mold-interconnect system buildup architecture in an integrated-circuit package substrate according to an embodiment; and FIG. 8 is included to show an example of a higher-level device application for the disclosed embodiments.

DETAILED DESCRIPTION

Disclosed embodiments include doped mold interconnect system (δMIS) examples, where metal-particle-doped molding materials are processed by patterned molding materials and activating exposed doping particles. Selected doping particles that are exposed during the laser etching of via and trench corridors, are activated to selectively allow electroless plating at the activated surfaces of the exposed particles. This process reduces lithographic and seed-layer etch steps to simplify process flow.

Further, processing embodiments include combining semi-additive plating techniques with disclosed δMIS techniques to increase layer functionality. Consequently, embedded architecture structures allow increased routing density, which results in increased performance in signaling among other qualities.

FIG. 1 is a cross-section elevation of an integrated-circuit package 100 that employs a doped mold interconnect system according to several embodiments. An integrated-circuit die 10 includes bond pads 11 that have been partially enclosed by a dielectric material 12. In an embodiment, the dielectric material 12 is known-technique dielectric for partially covering bond pads on a given integrated-circuit die.

In an embodiment, a first doped mold interconnect system (δMIS) layer 110 includes a mold-material matrix 111 with inactive catalyst particles 112. Further, activated catalyst particles 113 in the mold-material matrix 111, contact via and trench liners 114 and 115, respectively, which have been formed by catalytic electroless plating by use of the activated catalyst particles 113. In an embodiment, the activated catalyst particles 113 use selected metals, which have been formed by a number of techniques, that include laser activation, and electroless plating onto the activated catalyst particles 113. The activated catalyst particles 113 are exposed and activated during the formation of open via corridors and trenches.

The respective via and trench liners 114 and 115, line perimeters of both vias 116 and trenches 118. The vias 116 and trenches 118, each use the respective in-situ patterned and catalytically electroless-deposited liners 114 and 115 as catalytic electroless-deposition sites.

The respective absorption diagrams 112 and 113, correspond to palladium (Pd) particle analysis for the inactive catalyst particles 112, and the activated catalyst particles 113 in the mold-material matrix 111, depicted in FIG. 1. Other materials may be used as catalyst particles 112, as is appropriate for a given application.

In an embodiment, a subsequent δMIS layer 120 is located above the first δMIS layer 110, for which processing is similar. Above the subsequent δMIS layer 120, is a bumped layer 130 including electrical bumps 132, for direct coupling of the integrated-circuit package 100 onto a substrate such as a board. As depicted, the first via 116 in the first δMIS layer 110, is in-line coupled to the subsequent via 116' in the subsequent δMIS layer 120. In an embodiment as depicted, the first and subsequent vias are coupled by physical contact at the subsequent via liner 114'.

The first via 116 makes direct contact to the bond pad 11, by which "direct contact" may mean a first via liner 115 may be present at the bottom of the first via 116, but by definition the first via liner 116 may be subsumed into the overall structure of the filled via.

FIG. 1A is a cross-section top view of a portion of the structure depicted in FIG. 1, by rotating the arrow-tipped line A-A' through 180° in the X-Y plane according to an embodiment. The doped mold-material matrix 111 contains both inactive catalyst particles 112 and activated catalyst particles 113. The via liner 114 has a scalloped appearance that also impinges into the mold-material matrix 111. In an embodiment, the scalloped appearance is a result of laser drilling where overlapping circles represent laser impingement upon the mold-material matrix 111, followed by electroless plating of a material such as electronics-grade copper (Cu) onto the activated catalyst particles 113. The via liner 114 fills a portion of the via corridor, and the via 116 ekes out the balance volume of the via corridor. In an embodiment, the electrolessly plated via liner 114 can be detected such as by scanning electron microscopy (SEM) where grain formation onto the activated catalyst particles 113 is different than electroplating grain formation, where an electrical current is driving deposition onto a cathode structure.

Similarly, the structure of a trace 118 (see FIG. 1) includes the mold-material matrix 111, inactive particles near the trace 118, but activated catalyst particles that line the perimeter of the trace 118. Similarly, the trace liner 115 has a scalloped appearance that also impinges into the mold-material matrix 111. In an embodiment, the scalloped appearance is a result of laser drilling where overlapping circles represent pulsed-laser impingement upon the mold-material matrix 111, followed by electroless plating of a material such as electronics-grade copper onto the activated catalyst particles 113. The trace liner 115 fills a portion of the trace corridor, and the trace 118 ekes out the balance volume of the trace corridor.

Processing of integrated-circuit packages includes "die-first" and "die-last" techniques as disclosed, among others, to form δMIS layers according to several embodiments.

FIG. 2A represents an assembly 201 of selected structures of a "die-first" integrated-circuit package during assembly that employs a doped mold interconnect system according to several embodiments.

An integrated-circuit die 10 includes a bond pad 11, and the IC die 10 is seated on a carrier 13 for processing. The IC die 10 and the carrier 13 may be affixed by a material such as an adhesive that is package-processing grade.

In an embodiment, the IC die 10 is logic processor manufactured by Intel Corporation of Santa Clara, Calif. In an embodiment, the IC die 10 is a memory die. In an embodiment, the IC die 10 is a baseband communications die. In an embodiment, the IC die 10 is a platform controller hub die. In an embodiment, the IC die 10 is a bridge die.

At FIG. 2B, the assembly 201 in FIG. 2A has been processed to an assembly 202 according to an embodiment. In an embodiment, known-technique mold material 240 covers the IC die 10 and bond pads 11, as well as covers the surface of the carrier 13 that seats the IC die 10.

At FIG. 2C, the assembly 202 in FIG. 2B has been processed to an assembly 203 according to an embodiment. The illustration focuses on structures near two adjacent occurrences of bond pads 11 of the IC die 10 depicted in FIGS. 2A and 2B. A grinding technique has been used to remove excess mold material 240 (FIG. 2B), to form a dielectric material 12, such that the bond pads 11 are exposed.

At FIG. 2D, the assembly 203 in FIG. 2C has been processed to an assembly 204 according to an embodiment. A first δMIS layer 210 includes a mold-material matrix 211 with inactive catalyst particles 212 (one occurrence enumerated). Further, activated catalyst particles 213 (one occurrence enumerated) in the mold-material matrix 211 line perimeters of both via corridors and trench corridors. The via corridors are laser ablated to expose the bond pads 11. The via and trench corridors, each have respective in-situ patterned liners 214 and 215 which have been formed by a number of techniques, that include laser activation to achieve the activated catalyst particles 213, and electroless plating onto the activated catalyst particles 213. The activated catalyst particles 113 are exposed and activated during the formation of via corridors and trench corridors.

At FIG. 2E the assembly 204 in FIG. 2D has been processed to an assembly 205 according to an embodiment. Processing includes electroless plating of materials such as an electronics-grade copper (Cu) material onto the liners 214 and 215, which were plated onto the activated catalyst particles 213, to form vias 216 and trenches 218. Further processing of the vias 216 and trenches 218 include a grinding technique to compensate for both possible over and under-filling into the via and trench corridors according to an embodiment. And exemplar of over and under-filling is depicted in FIG. 3C. In an embodiment, the electroless plating of the liners 214 and 215, is silver (Ag). In an embodiment, the electroless plating of the liners 214 and 215, is a gold (Au) material. In an embodiment, the electroless plating of the liners 214 and 215, is a nickel (Ni) material. In an embodiment, the electroless plating of the liners 214 and 215, includes a cobalt (Co) material.

In an embodiment, a subsequent δMIS layer 220 is located above the first δMIS layer 210, for which processing is similar. As depicted, only a mold-material matrix 211 with inactive catalyst particles 212 has been formed, which in a technique to be employed thereafter, opens via corridors and trench corridors.

At FIG. 2F the assembly 205 in FIG. 2E has been processed to an assembly 206 according to an embodiment. Processing of the subsequent δMIS layer 220 has been substantially completed for illustrated structures to include via and trace liner 214 and 215, and filled vias and traces 216 and 218.

At FIG. 2G the assembly 206 in FIG. 2F has been processed to a δMIS-layer containing integrated-circuit package 200 according to an embodiment.

A bumped layer 230 is above the subsequent δMIS layer 220 for direct coupling of the integrated-circuit package 200 onto a substrate such as a board. In an embodiment, a third δMIS layer (not pictured) is located between the respective first and subsequent δMIS layers 210 and 220. It may now be understood that more than three δMIS layers can be assembled above the IC die 10, depending upon a useful δMIS layer configuration. Exemplary embodiments of more than two δMIS layers may be seen in FIG. 4G.

FIG. 3A is a cross-section elevation of an integrated-circuit package 301 during assembly according to an embodiment. FIG. 3A represents an assembly 301 of selected structures of a "die-first" integrated-circuit package, during assembly that employs a doped mold interconnect system according to several embodiments.

An integrated-circuit die 10 includes a bond pad 11, and the IC die 10 is seated on a carrier 13 for processing. The IC die 10 and the carrier 13 may be affixed by a material such as an adhesive that is package-processing grade.

At FIG. 3B, the assembly 301 in FIG. 3A has been processed to an assembly 302 according to an embodiment. In an embodiment, a δMIS layer 310 includes a doped mold material matrix 311, that is doped with activatable particles 312, covers the IC die 10 and bond pads 11, as well as covers the surface of the carrier 13 that seats the IC die 10. By contrast to previously depicted structure embodiments in FIGS. 1 and 2A-2G that uses a known-technique dielectric material 12, such as the assembly 204 depicted in FIG. 2D, the first δMIS layer 310 covers to contact the die 10 and the bond pads 11, and first δMIS layer 310 will support laser-ablation characteristic shaped vias and traces.

At FIG. 3C, the assembly 302 in FIG. 3B has been processed to an assembly 303 according to an embodiment. The illustration focuses on structures near two adjacent occurrences of bond pads 11 of the IC die 10 depicted in FIGS. 3A and 3B.

Processing includes opening via corridors and trace corridors, where the bond pads 11 are exposed at via-corridor bottoms, and while simultaneous activation of inactive catalyst particles 312, that become activated catalyst particles 313 at perimeters of contact and trace corridors. Thereafter, respective in-situ patterned liners 314 and 315 are formed by electroless plating into the contact and trace corridors, followed by deposition of the respective interim vias 316i and interim traces 318i.

A grinding technique is employed after achieving the assembly 303 as illustrated, to planarize the upper-Z surface of the first δMIS layer 310, and to obtain vias and traces that exhibit, e.g. dishing 316i or puddling 318i of vias and traces.

At FIG. 3D, the assembly 303 in FIG. 3C has been processed to a δMIS layer-containing integrated-circuit package 300 according to an embodiment. A subsequent δMIS layer 320 includes a mold-material matrix 311 with inactive catalyst particles 312 and, activated catalyst particles 313. Processing of the subsequent δMIS layer 320 has been substantially completed for illustrated structures, similarly to processing of the first δMIS layer 310.

Above the subsequent δMS layer 320, is a humped layer 330 including electrical bumps 332 for direct coupling of the activated-catalyst δMIS layer-containing integrated-circuit package 300 onto a substrate such as a board.

In an embodiment, a third δMIS layer (not pictured) is located between the respective first and subsequent δMIS layers 310 and 320. It may now be understood that more than three δMIS layers can be assembled above the IC die 10, depending upon a useful δMIS layer configuration. Exemplary embodiments of more than two δMIS layers may be seen in FIG. 4G.

Processing and achieving a "die-last" IC package is useful, to mate known good die (KGD) to known good δMIS layer-containing package (KGP).

FIG. 4A is a cross-section elevation of a catalyst-activated doped mold integration system 401 during a "die-last" assembly technique according to an embodiment.

A carrier 13 supports a seed layer 9, upon which a mask 15 such as a photoresist 15 has been patterned, and into which traces 7 and bond pads 8 have plated on the seed layer 9 according to an embodiment. The traces 7 and bond pads 8 are plated by electrolytic processing that uses the seed layer 9 as a cathode.

FIG. 4B is a cross-section elevation of the assembly depicted in FIG. 4A after further processing according to an embodiment. The assembly 402 shows structures, with the resist 15 depicted in FIG. 4A having been stripped. Consequently, portions of the seed layer 9 that are exposed between the traces 7 and bond pads 8, have been etched and removed according to an embodiment. In an embodiment, a directional etch removes the exposed portions of the seed layer 9. In an embodiment, a wet etch removes exposed portions of the seed layer 9, with inconsequential portions of the traces 7 and bond pads 8 being affected.

FIG. 4C is a cross-section elevation of an assembly 403 after further processing of the assembly 402 depicted in FIG. 4B according to an embodiment. In an embodiment, a doped mold material 410, that is doped with activatable particles 412, covers the traces 7 and bond pads 8, as well as covers the surface of the carrier 13.

Further processing includes opening via corridors and trace corridors, where the bond pads 8 are exposed by Z-direction laser ablation, but where the traces 7 are not exposed according to an embodiment. Simultaneous activation of inactive catalyst particles 412, result in activated catalyst particles 413 at perimeters of the via and trace corridors. Thereafter, respective in-situ patterned liners 414 and 415 are formed by electroless plating into the via and trace corridors, by catalytic electroless plating use of the activated catalyst particles 413, FIG. 4D is a cross-section elevation of an assembly 404 after further processing of the assembly 403 depicted in FIG. 4C according to an embodiment. Plating of interim vias 416i and interim traces 418i is done by use of the activated catalyst particles 413. A grinding technique will be employed after achieving the assembly 404 as illustrated, to planarize the upper-Z surface of the δMIS layer 410, and to obtain uniformly flat upper surfaces of vias and traces that exhibit, e.g. dishing 416i or puddling 418i of respective vias and traces.

FIG. 4E is cross-sectional elevation of an assembly 405 that is being post-processed from the assembly 404 depicted in FIG. 4D according to an embodiment. Further processing of the interim vias 416i and interim trenches 418i, seen in FIG. 4D, include a grinding technique to compensate for both possible over and under-filling into the via and trench corridors according to an embodiment.

In an embodiment, a subsequent δMIS layer 420 is located above the first δMIS layer 410, for which processing is similar. As depicted, only a mold-material matrix 411 with inactive catalyst particles 412 has been formed, which in a technique thereafter opens via corridors and trench corridors.

At FIG. 4F the assembly 405 in FIG. 4E has been processed to an assembly 406 according to an embodiment. Processing of the subsequent δMIS layer 420 has been substantially completed for illustrated structures including vias 416 and traces 418.

At FIG. 4G the assembly 406 in FIG. 4F has been processed to an assembly 407 according to a branching embodiment. Processing of a subsequent δMIS layer 420, is preceded by processing of a third δMIS layer 450, a fourth δMIS layer 452, and a fifth δMIS layer 454. Thereafter, the subsequent δMIS layer 420 completes all δMIS-containing layers. In an embodiment, three δMIS layers are used including the subsequent δMIS layer 420 as the top layer. In an embodiment, four δMIS layers are used including the subsequent δMIS layer 420 as the top layer.

It is observed that the fourth δMIS layer 452 includes traces 418yz with its principal form factor in the yz dimension and that run orthogonal to the plane of the drawing, as well as at least on trace 418xz with its principal form factor in the xz dimension that run across the plane of the drawing.

FIG. 4H is a cross-section elevation of an integrated-circuit package substrate 408 containing doped mold interconnect system layers according to several embodiments. The assembly 407 depicted in FIG. 4G has been stripped of the carrier 13, inverted, and a land side layer 430 including land side bumps 432, has been assembled to the subsequent δMIS layer 420. Further, a solder resist layer 460 has been formed on the first δMIS layer 410, including solder-paste bumps 462 that contact the bond pads 8. The solder resist layer 460 presents a die side of the IC package substrate 408.

As configured, the integrated-circuit package substrate 408 containing several δMIS layers is an extract from an integrated-circuit die package depicted in FIG. 4K. after assembly, the assembly 408 is tested and certified as a δMIS containing KGP 408.

FIG. 4K is a cross-section elevation of an integrated-circuit die package 400 that includes several doped mold interconnect system layers according to several embodiments. Items 4I and 4J are omitted.

An integrated-circuit die 10 has been assembled on the die side, to reflowed solder bumps 462 that couple bond pads 8 through the resist layer 460. As illustrated a known good die (KGD) 10 is mated to a δMIS layer known good package (KGP) 408 (e.g. FIG. 4H) where each KDG and KGP has passed testing to useful bin-split techniques, before mating.

In an embodiment, the land side bumps 432 are assembled to a board 470 such as a motherboard 470. In an embodiment, an external shell 472 is an integral part of the board 470, where the external shell 472 is the exterior of a mobile computing system such as a tablet or wireless telephone. In an embodiment, the external shell 472 is an integral portion of the board 470, that is the exterior of an autonomous computing vehicle such as a drone.

FIG. 5A is cross-section elevation of a die-last doped mold-interconnect system 501 that mixes laser-formed vias and traces and photolithographically formed traces according to an embodiment. Processing is carried out similar to the techniques depicted in FIGS. 4A-4D, upon a carrier 13. Processing is followed by formation of a seed layer 9, upon a first δMIS layer 510.

The seed layer 9 forms to touch vias 516 and traces 518 that were electrolessly plated by use of via and trace liners 514 and 515 that were electrolessly plated onto activated catalyst particle 513 that are activated from inactive catalyst particles 512 during laser formation of respective bis and trace corridors. The laser and photolithographically formed traces are within the first δMIS layer 510. Thereafter as illustrated, a mask 15 is patterned over the seed layer 9, followed by electroless deposition of terminals 521 according to an embodiment.

FIG. 5B is a cross-section elevation of a doped mold interconnect system 502 after further processing of the doped mold interconnect system 501 depicted in FIG. 5A according to several embodiments.

After removal of the mask 15 depicted in FIG. 5A, the several terminals 521 are isolated by an etch technique to remove exposed portions of the seed layer 9. A subsequent δMIS layer 520 is formed on the first δMIS layer 510, and over the several terminals 521, followed by a subsequent formation of activated catalyst particles 513 within the subsequent δMIS layer 520, by which via corridors are opened that expose bond pads 8, but trace corridors are laser ablated more shallowly than the via corridors. Thereafter, electroless via plating is done to form vias 516 within the subsequent δMIS layer 520. Consequently within the subsequent δMIS layer 520, both photolithographically formed terminals 521 and laser via corridor-shaped vias 516 are found.

A photolithographically formed terminal 521 may be characterized in cross-section profile compared to a laser via-corridor cross section profile, where side walls of the photolithographically (photolitho) formed terminal, approach orthogonality compared to laser via-corridor walls are always an external acute angle. One characteristic of photolitho terminals 521 and laser-etch vias 516 within a given δMIS layer 520 is that they each share at least one border surface within the δMIS layer 520. In the instantiation of the subsequent δMIS layer 520, the photolitho terminals 521 and the laser-etch vias 516 share the border-interface surface with the first δMIS layer 510.

FIG. 5C is a cross-section elevation of a doped mold-interconnect system integrated-circuit package substrate 503 after further processing the assembly 502 depicted in FIG. 5B according to several embodiments. The assembly 502 depicted in FIG. 5B has been stripped of the carrier 13, inverted, and a land side layer 530 including land side humps 532 have been assembled to the subsequent δMIS layer 520. Further, a solder resist layer 560 has been formed on the first δMIS layer 510, including solder-paste bumps 562 that contact the bond pads 8. The solder resist layer 560 presents a die side of the δMIS layer-containing IC package substrate 503. As configured, the integrated-circuit package substrate 508 containing several δMIS layers is an exemplar extract from completed δMIS containing integrated-circuit die package. After assembly, the assembly 503 is tested and certified as a δMIS-layer containing KGP 503.

FIG. 6A is cross-section elevation of an embedded multi-die integrated-circuit package 601 during assembly, that uses doped mold interconnect system layers according to a several embodiments. In an embodiment, a dielectric material 12 is formed on a carrier 13, and package bond pads 8 are first formed on the dielectric material 12, such as by patterning a seed layer and etching to isolated the package bond pads 8. The "package bond pad 8" will communicate at a perimeter of an integrated-circuit package after removing the carrier 13, such that the first. IC die 10 at a backside surface 6, such that the package bond pad 8 and the backside surface 6 will share surfaces that are "packaging coplanar", which means in this embodiment, as there were each seated on the dielectric material 12, which is planarized by the carrier 13, the bond pad 8 and the backside surface 6 are packaging coplanar within usual analytical parameters of structural characteristics of IC package substrates.

Thereafter, an integrated-circuit die 10, including die bond pads 11, is seated between the bond pads 8 on the dielectric material 12. The dielectric material 12 is a known-technique dielectric for contacting bond pads and integrated-circuit dice.

FIG. 6B is a cross-section elevation of the assembly 601 depicted in FIG. 6A after further processing according to an embodiment. The assembly 602 has been processed by depositing a catalyst δMIS layer 610 over the bond pads 8 and the IC die 10. Thereafter, laser etching opens via corridors, while activating selected catalyst particles 613 within a mold-material matrix 611. During laser etching to form via corridors inactive catalyst particles 612 at the perimeters of the laser-formed via corridors, become activated catalyst particles 613 in the mold-material matrix 611. The via corridors, each have in-situ patterned liners 614 which have been formed by a number of techniques, that include laser activation of the activated catalyst particles 613, and electroless plating onto the activated catalyst particles 613.

After forming the via liners 614 by electroless plating into the via corridors, electroless deposition of interim vias 616i is done, to be followed by planarization.

FIG. 6C is a cross-section elevation of an assembly 603 that contains a catalyst δMIS layer 610 after back grinding according to an embodiment. Vias 616 that were formed against the via liners 614, are flattened and standardized, and the IC die bond pads 11 are also brought to a same Z-height as the vias 616.

FIG. 6D is a cross-section elevation of an assembly 604 after further processing the assembly 603 depicted in FIG. 6C according to an embodiment. A second catalyst δMIS layer 620 is formed after seating of a second IC die 20 and a third IC die 30, which are coupled to the vias 616. Further, second vias 616' are formed in the second catalyst δMIS layer 620, which couple to the first IC die 10.

In an embodiment, at least one trace 618 is also formed in the second catalyst δMIS layer 620, for further densify interconnections to serve communication among the several IC dice. Further processing includes forming a subsequent δMIS layer (not pictured) to couple the first IC die 10 to the second and third IC dice 20 and 30. After assembly as described, the carrier 13 is removable.

FIG. 6E is a cross-section elevation of an assembly 605 after further processing the assembly 603 depicted in FIG. 6C according to an embodiment. A second IC die 40 straddles and is face-to-face coupled to the first IC die 10, and the second IC die 40 is also coupled to the vias 616, which may be referred to as first and second vias. After assembly as depicted, the carrier 13 is removable.

FIG. 6F is a cross-section elevation of an assembly 606 after further processing the assembly 603 depicted in FIG. 6C according to an embodiment. The first IC die 10 acts as an embedded multi-die interconnect bridge 10 (EMIB), which serves a second die 50 and a third die 60 for a high-density interconnect therebetween. The second die 50 and the third die 60 are at least partially mated face-to-face with the first die 10 and each of the second die 50 and the third die contact package vias that are substantially packaging coplanar with the backside surface 6. After assembly as depicted, the carrier 13 is removable.

FIG. 7 is a process flow diagram 700 for assembling an integrated-circuit apparatus that includes a δMIS buildup architecture in an integrated-circuit package substrate according to an embodiment.

At 710, the process includes laser ablating a catalyst-particle containing mold material matrix to open a via corridor. The laser beam may be characterized as a pulsed coherent energy that is of sufficient power to change oxidation state of the inactive particles to activated catalyst particles. The laser ablating forms activated catalyst particles at the perimeter of the void such as a via corridor.

At 720, the process includes electroless plating a via liner onto activated catalyst particles at the periphery of the via corridor.

At 730, the process includes electroless plating a via onto the via liner.

At 740, the process includes coupling the via to an integrated-circuit die.

At 750, the process includes assembling the IC die to a computing system.

At 701, the process may include photolitho forming of a trace or bond pad.

At 702, the process may include covering the trace or bond pad with a δMIS layer and processing such as at 710 through 730.

FIG. 8 is included to show an example of a higher-level device application for the disclosed embodiments. The doped mold interconnect system embodiments may be found in several parts of a computing system. In an embodiment, the doped mold interconnect system embodiments can be part of a communications apparatus such as is affixed to a cellular communications tower. In an embodiment, a computing system 800 includes, but is not limited to, a desktop computer. In an embodiment, a computing system 800 includes, but is not limited to a laptop computer. In an embodiment, a computing system 800 includes, but is not limited to a tablet. In an embodiment, a computing system 800 includes, but is not limited to a notebook computer. In an embodiment, a computing system 800 includes, but is not limited to a personal digital assistant (PDA). In an embodiment, a computing system 800 includes, but is not limited to a server. In an embodiment, a computing system 800 includes, but is not limited to a workstation. In an embodiment, a computing system 800 includes, but is not limited to a cellular telephone. In an embodiment, a computing system 800 includes, but is not limited to a mobile computing device. In an embodiment, a computing system 800 includes, but is not limited to a smart phone. In an embodiment, a system 800 includes, but is not limited to an internet appliance. Other types of computing devices may be configured with the microelectronic device that includes doped mold interconnect system embodiments.

In an embodiment, the processor 810 has one or more processing cores 812 and 812N, where 812N represents the Nth processor core inside processor 810 where N is a positive integer. In an embodiment, the electronic device system 800 using a doped mold interconnect system embodiment that includes multiple processors including 810 and 805, where the processor 805 has logic similar or identical to the logic of the processor 810. In an embodiment, the processing core 812 includes, but is not limited to, pre-fetch logic to fetch instructions, decode logic to decode the instructions, execution logic to execute instructions and the like. In an embodiment, the processor 810 has a cache memory 816 to cache at least one of instructions and data for the doped mold interconnect system element on an integrated-circuit package substrate in the system 800. The cache memory 816 may be organized into a hierarchal structure including one or more levels of cache memory.

In an embodiment, the processor 810 includes a memory controller 814, which is operable to perform functions that enable the processor 810 to access and communicate with memory 830 that includes at least one of a volatile memory 832 and a non-volatile memory 834. In an embodiment, the processor 810 is coupled with memory 830 and chipset 820. In an embodiment, the chipset 820 is part of a doped mold interconnect system embodiment depicted in any of FIGS. 1, 2G, 3D, 4H, 4K, 5C, and 6D, 6E and 6F and variations as disclosed.

The processor 810 may also be coupled to a wireless antenna 878 to communicate with any device configured to at least one of transmit and receive wireless signals. In an embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 832 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 834 includes, but is not limited to, flash memory, phase change memory (PCM), read-only memory (ROM), electrically erasable programmable read-only memory (EEPROM), or any other type of non-volatile memory device.

The memory 830 stores information and instructions to be executed by the processor 810. In an embodiment, the memory 830 may also store temporary variables or other intermediate information while the processor 810 is executing instructions. In the illustrated embodiment, the chipset 820 connects with processor 810 via Point-to-Point (PtP or P-P) interfaces 817 and 822. Either of these PtP embodiments may be achieved using a doped mold interconnect system embodiment as set forth in this disclosure. The chipset 820 enables the processor 810 to connect to other elements in a doped mold interconnect system embodiment in a system 800. In an embodiment, interfaces 817 and 822 operate in accordance with a PtP communication protocol such as the Intel® QuickPath Interconnect (QPI) or the like. In other embodiments, a different interconnect may be used.

In an embodiment, the chipset 820 is operable to communicate with the processor 810, 805N, the display device 840, and other devices 872, 876, 874, 860, 862, 864, 866, 877, etc. The chipset 820 may also be coupled to a wireless antenna 878 to communicate with any device configured to at least do one of transmit and receive wireless signals.

The chipset 820 connects to the display device 840 via the interface 826. The display 840 may be, for example, a liquid crystal display (LCD), a plasma display, cathode ray tube (CRT) display, or any other form of visual display device. In an embodiment, the processor 810 and the chipset 820 are merged into a doped mold interconnect system embodiment in a system. Additionally, the chipset 820 connects to one or more buses 850 and 855 that interconnect various elements 874, 860, 862, 864, and 866. Buses 850 and 855 may be interconnected together via a bus bridge 872 such as at least one doped mold interconnect system embodiment. In an embodiment, the chipset 820, via interface 824, couples with a non-volatile memory 860, a mass storage device(s) 862, a keyboard/mouse 864, a network interface 866, smart TV 876, and the consumer electronics 877, etc.

In an embodiment, the mass storage device 862 includes, but is not limited to, a solid-state drive, a hard disk drive, a universal serial bus flash memory drive, or any other form of computer data storage medium. In one embodiment, the network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UVB), Bluetooth, WiMax, or any form of wireless communication protocol.

While the modules shown in FIG. 8 are depicted as separate blocks within the doped mold interconnect system embodiments in a computing system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into the processor core 812.

To illustrate the doped mold interconnect system embodiments and methods disclosed herein, a non-limiting list of examples is provided herein:

Example 1 is an integrated circuit package substrate, comprising: a doped mold layer including activated catalyst particles that are at a perimeter of a via corridor, and inactive catalyst particles in a mold-material matrix of the doped mold layer; a via-corridor liner of an electrically conductive material that contacts the activated catalyst particles; a via contacting the via-corridor liner and eking out the via corridor; and wherein the via contacts at least one of a bond pad and a trace.

In Example 2, the subject matter of Example 1 optionally includes at least two integrated circuit dice, one of which coupled to the via, and wherein the at least two integrated circuit dice are part of a chipset in a computing system.

In Example 3, the subject matter of any one or more of Examples 1-2 optionally include wherein the inactive catalyst particles include palladium-containing particles that exhibit a first oxidative state, and wherein the activated catalyst particles include palladium-containing particles that exhibit a different oxidative state from the first oxidative state.

In Example 4, the subject matter of any one or more of Examples 1-3 optionally include activated catalyst particles that are at a perimeter of a trace corridor, and the inactive particles in the mold-material matrix; a trace-corridor liner of an electrically conductive material that contacts the activated catalyst particles; and a trace contacting the trace-corridor liner and eking out the trace corridor.

In Example 5, the subject matter of any one or more of Examples 1-4 optionally include activated catalyst particles that are at a perimeter of a trace corridor, and the inactive particles in the mold-material matrix; a trace-corridor liner of an electrically conductive material that contacts the activated catalyst particles; a trace contacting the trace-corridor liner and eking out the trace corridor; and an integrated-circuit die coupled to the via by direct contact to a bond pad on the IC die.

In Example 6, the subject matter of any one or more of Examples 1-5 optionally include wherein the doped mold layer is a first doped mold layer, wherein the via is a first via, and wherein the via is a first via further including: a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer; a subsequent via-corridor liner of an electrically conductive material that contacts the activated catalyst particles; a subsequent via contacting the via-corridor liner and eking out the subsequent via corridor; and wherein the subsequent via contacts the first via.

In Example 7, the subject matter of any one or more of Examples 1-6 optionally include wherein the doped mold layer is a first doped mold layer, wherein the via is a first via, and wherein the via corridor is a first via corridor further including: a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer; a subsequent via-corridor liner of an electrically conductive material that contacts the activated catalyst particles; a subsequent via contacting the via-corridor liner and eking out the subsequent via corridor; wherein the subsequent via contacts the first via; and an integrated-circuit die coupled to the first via by direct contact to a bond pad on the IC die.

In Example 8, the subject matter of any one or more of Examples 1-7 optionally include wherein the doped mold layer is a first doped mold layer, wherein the via is a first via, and wherein the via corridor is a first via further including: a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer; a subsequent via-corridor liner of an electrically conductive material that contacts the activated catalyst particles; a subsequent via contacting the via-corridor liner and eking out the subsequent via corridor; wherein the subsequent via is in-line coupled to the first via; and a photolitho terminal in the subsequent doped mold layer at an interface between the first mold layer and the subsequent mold layer, wherein the photolitho terminal exhibits substantially orthogonal walls and the subsequent via exhibits acute angle walls.

In Example 9, the subject matter of any one or more of Examples 1-8 optionally include wherein the doped mold layer is a first doped mold layer, wherein the via is a first via, and wherein the via is a first via further including: a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer; a subsequent via-corridor liner of an electrically conductive material that contacts the activated catalyst particles; a subsequent via contacting the via-corridor liner and eking out the subsequent via corridor; wherein the subsequent via is in-line coupled to the first via; a third doped mold layer above and contacting the first doped mold layer, wherein the third doped mold layer including activated catalyst particles that are at a perimeter of a third via corridor, and inactive catalyst particles in a third mold-material matrix of the third doped mold layer; a third via-corridor liner of an electrically conductive material that contacts the activated catalyst particles; a third via contacting the third via-corridor liner and eking out the third via corridor; and wherein the third via contacts the subsequent via.

In Example 10, the subject matter of any one or more of Examples 1-9 optionally include wherein the doped mold layer is a first doped mold layer, wherein the via is a first via, and wherein the via is a first via further including: a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer; a subsequent via-corridor liner of an electrically conductive material that contacts the activated catalyst particles; a subsequent via contacting the via-corridor liner and eking out the subsequent via corridor; wherein the subsequent via is in-line coupled to the first via; a third doped mold layer above and contacting the first doped mold layer, wherein the third doped mold layer including activated catalyst particles that are at a perimeter of a third via corridor, and inactive catalyst particles in a third mold-material matrix of the third doped mold layer; a third via-corridor liner of an electrically conductive material that contacts the activated catalyst particles; a third via contacting the third via-corridor liner and eking out the third via corridor; wherein the third via contacts the subsequent via; and an integrated-circuit die coupled to the third via by direct contact to a bond pad on the IC die.

Example 11 is an integrated-circuit device package, comprising: an integrated-circuit die at least partially covered by a doped mold layer, the doped mold layer including: activated catalyst particles that are at a perimeter of a via corridor, and inactive catalyst particles in a mold-material matrix of the doped mold layer; a via-corridor liner of an electrically conductive material that contacts the activated catalyst particles; a via contacting the via-corridor liner and eking out the via corridor; and wherein the via is coupled to a die bond pad on the integrated-circuit die.

In Example 12, the subject matter of Example 11 optionally includes wherein the integrated circuit die is one of at least two integrated circuit dice, one of which coupled to the via, and wherein the at least two integrated circuit dice are part of a chipset in a computing system.

In Example 13, the subject matter of any one or more of Examples 11-12 optionally include wherein the integrated circuit die is a first IC die, the first IC die including a backside surface opposite the die bond pad, further including: a second IC die at least partially embedded in the doped mold layer, wherein the second IC die is coupled to the first IC die, and wherein the second IC die contacts a via that contacts a package bond pad, wherein the backside surface and the package bond pad exhibit surfaces that are packaging coplanar.

In Example 14, the subject matter of any one or more of Examples 11-13 optionally include wherein integrated circuit die is a first IC die, wherein the via is a first via contacting the die bond pad, further including: a second IC die at least partially embedded in the doped mold layer, wherein the second IC die contacts a second via; and a package bond pad that contacts the second via.

In Example 15, the subject matter of any one or more of Examples 11-14 optionally include wherein integrated circuit die is a first IC die, wherein the via is a first via contacting the die bond pad, further including: a second IC die at least partially embedded in the doped mold layer, wherein the second IC die contacts a second via; a package bond pad that contacts the second via; a third IC die at least partially embedded in the doped mold layer, wherein the third IC die contacts a third via; a package bond pad that contacts the third via; and wherein the package bond pads that contact the respective second and third vias and the die backside surface, exhibit surfaces that are packaging coplanar.

In Example 16, the subject matter of any one or more of Examples 11-15 optionally include wherein the IC die is a first IC die including a backside surface, further including: a subsequent IC die that is face-to-face mated to the first IC die at the die bond pad; wherein the via contacts the subsequent die; and a package bond pad that contacts the via, and wherein the backside surface and the package bond pad exhibit surfaces that are packaging coplanar.

In Example 17, the subject matter of any one or more of Examples 11-16 optionally include wherein the integrated circuit die is a first IC die with a backside surface, and wherein the via is a first via, further including: a second IC die mated in part face-to-face with the first IC die and mated to the first via; and wherein the first via contacts a package bond pad, and wherein the backside surface and the package bond pad exhibit surfaces that are packaging coplanar.

In Example 18, the subject matter of any one or more of Examples 11-17 optionally include wherein the integrated circuit die is a first IC die with a backside surface, and wherein the via is a first via, further including: a second IC die mated in part face-to-face with the first IC die and mated to the first via, wherein the first via contacts a package bond pad; a third IC die mated in part face-to-face with the first IC die and mated to a second via, wherein the second via contacts a package bond pad; and wherein the backside surface and the package bond pads contacting the respective first and second vias, exhibit surfaces that are packaging coplanar.

Example 19 is a process of forming a doped mold layer, comprising: applying pulsed coherent energy within a molding material matrix that contains inactive metallic particles, to form a via corridor with activated catalyst particles at a perimeter of the via corridor; electroless plating a via metal liner upon the activated catalyst particles; and eking out the via by electroplating a metal via on the via metal liner.

In Example 20, the subject matter of Example 19 optionally includes applying pulsed coherent energy within the molding material matrix, to form a trace corridor with activated catalyst particles at a perimeter of the trace corridor; electroless plating a trace metal liner upon the activated catalyst particles; and eking out the trace by electroplating a metal trace on the trace metal liner.

In Example 21, the subject matter of any one or more of Examples 19-20 optionally include wherein the molding material matrix forms a first doped molding material layer, further including: applying a subsequent doped molding material above the first doped molding material; applying pulsed coherent energy within the subsequent doped molding material, that include a mold material matrix that contains subsequent inactive metallic particles, to form a subsequent via corridor with subsequent activated catalyst particles at a perimeter of the subsequent via corridor; electroless plating a subsequent via metal liner upon the subsequent activated catalyst particles; and eking out the subsequent via by electroplating a subsequent metal via on the subsequent via metal liner.

In Example 22, the subject matter of any one or more of Examples 1-21 optionally include where the liner layer has a metallic grain structure that is characteristic of electroless plating processes.

In Example 23, the subject matter of any one or more of Examples 1-22 optionally include where the via that ekes out the via corridor at the liner layer, has a metallic grain structure that is characteristic of electroless plating processes.

In Example 24, the subject matter of any one or more of Examples 1-23 optionally include wherein at least the via liner and the via is assembled from one of a group consisting of a combination of a copper material, a silver material, a gold material, a nickel material, and a cobalt material.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated circuit package substrate, comprising:
    a doped mold layer including activated catalyst particles that are at a perimeter of a via corridor, and inactive catalyst particles in a mold-material matrix of the doped mold layer, wherein the inactive catalyst particles include palladium-containing particles that exhibit a first oxidative state, and wherein the activated catalyst particles include palladium-containing particles that exhibit a different oxidative state from the first oxidative state;
    a via-corridor liner of an electrically conductive material that contacts the activated catalyst particles;
    a via contacting the via-corridor liner and eking out the via corridor; and
    wherein the via contacts at least one of a bond pad and a trace.

2. The integrated circuit package substrate of claim 1, further including at least two integrated circuit dice, one of which coupled to the via, and wherein the at least two integrated circuit dice are part of a chipset in a computing system.

3. The integrated circuit package substrate of claim 1, further including:
    activated catalyst particles that are at a perimeter of a trace corridor, and the inactive particles in the mold-material matrix;
    a trace-corridor liner of an electrically conductive material that contacts the activated catalyst particles; and
    a trace contacting the trace-corridor liner and eking out the trace corridor.

4. The integrated circuit package substrate of claim 1, further including:
    activated catalyst particles that are at a perimeter of a trace corridor, and the inactive particles in the mold-material matrix;
    a trace-corridor liner of an electrically conductive material that contacts the activated catalyst particles;
    a trace contacting the trace-corridor liner and eking out the trace corridor; and
    an integrated-circuit die coupled to the via by direct contact to a bond pad on the IC die.

5. The integrated circuit package substrate of claim 1, wherein the doped mold layer is a first doped mold layer, wherein the via is a first via, and wherein the via is a first via further including:
    a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer;
    a subsequent via-corridor liner of an electrically conductive material that contacts the activated catalyst particles;
    a subsequent via contacting the via-corridor liner and eking out the subsequent via corridor; and
    wherein the subsequent via contacts the first via.

6. The integrated circuit package substrate of claim 1, wherein the doped mold layer is a first doped mold layer, wherein the via is a first via, and wherein the via corridor is a first via corridor further including:
    a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer;
    a subsequent via-corridor liner of an electrically conductive material that contacts the activated catalyst particles;
    a subsequent via contacting the via-corridor liner and eking out the subsequent via corridor;
    wherein the subsequent via contacts the first via; and
    an integrated-circuit die coupled to the first via by direct contact to a bond pad on the IC die.

7. The integrated circuit package substrate of claim 1, wherein the doped mold layer is a first doped mold layer, wherein the via is a first via, and wherein the via corridor is a first via further including:
    a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer;
    a subsequent via-corridor liner of an electrically conductive material that contacts the activated catalyst particles;

a subsequent via contacting the via-corridor liner and eking out the subsequent via corridor;
wherein the subsequent via is in-line coupled to the first via; and
a photolitho terminal in the subsequent doped mold layer at an interface between the first mold layer and the subsequent mold layer, wherein the photolitho terminal exhibits substantially orthogonal walls and the subsequent via exhibits acute angle walls.

8. The integrated circuit package substrate of claim 1, wherein the doped mold layer is a first doped mold layer, wherein the via is a first via, and wherein the via is a first via further including:
a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer;
a subsequent via-corridor liner of an electrically conductive material that contacts the activated catalyst particles;
a subsequent via contacting the via-corridor liner and eking out the subsequent via corridor;
wherein the subsequent via is in-line coupled to the first via;
a third doped mold layer above and contacting the first doped mold layer, wherein the third doped mold layer including activated catalyst particles that are at a perimeter of a third via corridor, and inactive catalyst particles in a third mold-material matrix of the third doped mold layer;
a third via-corridor liner of an electrically conductive material that contacts the activated catalyst particles;
a third via contacting the third via-corridor liner and eking out the third via corridor; and
wherein the third via contacts the subsequent via.

9. The integrated circuit package substrate of claim 1, wherein the doped mold layer is a first doped mold layer, wherein the via is a first via, and wherein the via is a first via further including:
a subsequent doped mold layer above the first doped mold layer, wherein the subsequent doped mold layer including activated catalyst particles that are at a perimeter of a subsequent via corridor, and inactive catalyst particles in a subsequent mold-material matrix of the subsequent doped mold layer;
a subsequent via-corridor liner of an electrically conductive material that contacts the activated catalyst particles;
a subsequent via contacting the via-corridor liner and eking out the subsequent via corridor;
wherein the subsequent via is in-line coupled to the first via;
a third doped mold layer above and contacting the first doped mold layer, wherein the third doped mold layer including activated catalyst particles that are at a perimeter of a third via corridor, and inactive catalyst particles in a third mold-material matrix of the third doped mold layer;
a third via-corridor liner of an electrically conductive material that contacts the activated catalyst particles;
a third via contacting the third via-corridor liner and eking out the third via corridor;
wherein the third via contacts the subsequent via; and
an integrated-circuit die coupled to the third via by direct contact to a bond pad on the IC die.

10. An integrated-circuit device package, comprising:
an integrated-circuit die at least partially covered by a doped mold layer, the doped mold layer including:
activated catalyst particles that are at a perimeter of a via corridor, and inactive catalyst particles in a mold-material matrix of the doped mold layer, wherein the inactive catalyst particles include palladium-containing particles that exhibit a first oxidative state, and wherein the activated catalyst particles include palladium-containing particles that exhibit a different oxidative state from the first oxidative state;
a via-corridor liner of an electrically conductive material that contacts the activated catalyst particles;
a via contacting the via-corridor liner and eking out the via corridor; and
wherein the via is coupled to a die bond pad on the integrated-circuit die.

11. The integrated circuit package substrate of claim 10, wherein the integrated circuit die is one of at least two integrated circuit dice, one of which coupled to the via, and wherein the at least two integrated circuit dice are part of a chipset in a computing system.

12. The integrated-circuit device package of claim 10, wherein the integrated circuit die is a first IC die, the first IC die including a backside surface opposite the die bond pad, further including:
a second IC die at least partially embedded in the doped mold layer, wherein the second IC die is coupled to the first IC die, and wherein the second IC die contacts a via that contacts a package bond pad, wherein the backside surface and the package bond pad exhibit surfaces that are packaging coplanar.

13. The integrated circuit device package of claim 10, wherein integrated circuit die is a first IC die, wherein the via is a first via contacting the die bond pad, further including:
a second IC die at least partially embedded in the doped mold layer, wherein the second IC die contacts a second via; and
a package bond pad that contacts the second via.

14. The integrated circuit device package of claim 10, wherein integrated circuit die is a first IC die, wherein the via is a first via contacting the die bond pad, further including:
a second IC die at least partially embedded in the doped mold layer, wherein the second IC die contacts a second via;
a package bond pad that contacts the second via;
a third IC die at least partially embedded in the doped mold layer, wherein the third IC die contacts a third via;
a package bond pad that contacts the third via; and
wherein the package bond pads that contact the respective second and third vias and a die backside surface of the first die, exhibit surfaces that are packaging coplanar.

15. The integrated circuit device package of claim 10, wherein the IC die is a first IC die including a backside surface, further including:
a subsequent IC die that is face-to-face mated to the first IC die at the die bond pad;
wherein the via contacts the subsequent die; and
a package bond pad that contacts the via, and wherein the backside surface and the package bond pad exhibit surfaces that are packaging coplanar.

16. The integrated circuit device package of claim 10, wherein the integrated circuit die is a first IC die with a backside surface, and wherein the via is a first via, further including:
a second IC die mated in part face-to-face with the first IC die and mated to the first via; and wherein the first via contacts a package bond pad, and wherein the backside surface and the package bond pad exhibit surfaces that are packaging coplanar.

17. The integrated circuit device package of claim 10, wherein the integrated circuit die is a first IC die with a backside surface, and wherein the via is a first via, further including:
- a second IC die mated in part face-to-face with the first IC die and mated to the first via, wherein the first via contacts a package bond pad;
- a third IC die mated in part face-to-face with the first IC die and mated to a second via, wherein the second via contacts a package bond pad; and
- wherein the backside surface and the package bond pads contacting the respective first and second vias, exhibit surfaces that are packaging coplanar.

* * * * *